(12) United States Patent
Kim et al.

(10) Patent No.: US 12,476,191 B2
(45) Date of Patent: Nov. 18, 2025

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Junhyoung Kim, Seoul (KR); Kangmin Kim, Hwaseong-si (KR); Changhwan Lee, Yongin-si (KR); Taemin Eom, Suwon-si (KR); Seungmin Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 892 days.

(21) Appl. No.: 17/567,249

(22) Filed: Jan. 3, 2022

(65) Prior Publication Data

US 2022/0367359 A1 Nov. 17, 2022

(30) Foreign Application Priority Data

May 14, 2021 (KR) .................. 10-2021-0062809

(51) Int. Cl.
*H10B 41/10* (2023.01)
*H01L 23/535* (2006.01)
(Continued)

(52) U.S. Cl.
CPC .......... *H01L 23/535* (2013.01); *H10B 41/27* (2023.02); *H10B 41/41* (2023.02); *H10B 43/27* (2023.02); *H10B 43/40* (2023.02)

(58) Field of Classification Search
CPC ....... H01L 23/535; H10B 41/41; H10B 43/27; H10B 41/27; H10B 43/40; H10B 43/50; H10B 12/482
See application file for complete search history.

(56) References Cited

U.S. PATENT DOCUMENTS 8,598,710 B2 12/2013 Park et al.
10,043,817 B2 8/2018 Lee et al.
(Continued)

FOREIGN PATENT DOCUMENTS

KR 1020160109989 A 9/2016
KR 1020200073702 A 6/2020
KR 1020210015218 A 2/2021

*Primary Examiner* — Yara B Green
*Assistant Examiner* — Coralie A Nettles
(74) *Attorney, Agent, or Firm* — Muir Patent Law, PLLC

(57) ABSTRACT

A semiconductor device includes a first structure including a substrate, circuit devices, a lower interconnection structure electrically connected to the circuit devices, and a second structure on the first structure. The second structure includes a conductive plate layer; gate electrodes on the conductive plate layer and extending in a first direction; separation regions penetrating through the gate electrodes and extending in the first direction; channel structures penetrating through the gate electrodes and respectively including a channel layer; through-contact plugs spaced apart from the gate electrodes and extending in the vertical direction to be electrically connected to the lower interconnection structure of the first structure; first and second contacts electrically connected to the channel layer and the through-contact plugs, respectively; bitlines electrically connecting at least one of each of the first and second contacts to each other; and dummy contacts connected to the bitlines and spaced apart from the through-contact plugs.

20 Claims, 30 Drawing Sheets

(51) Int. Cl.
  *H10B 41/20*   (2023.01)
  *H10B 41/27*   (2023.01)
  *H10B 41/30*   (2023.01)
  *H10B 41/40*   (2023.01)
  *H10B 41/41*   (2023.01)
  *H10B 41/50*   (2023.01)
  *H10B 43/10*   (2023.01)
  *H10B 43/27*   (2023.01)
  *H10B 43/30*   (2023.01)
  *H10B 43/40*   (2023.01)
  *H10B 43/50*   (2023.01)

(56) References Cited

U.S. PATENT DOCUMENTS

| | | | |
|---|---|---|---|
| 10,446,570 | B2 | 10/2019 | Lee et al. |
| 2009/0135639 | A1* | 5/2009 | Hirose ............ G11C 7/08 365/72 |
| 2016/0268264 | A1* | 9/2016 | Hwang ............ H10B 43/20 |
| 2016/0336340 | A1* | 11/2016 | Song ............ H01L 21/764 |
| 2019/0051600 | A1 | 2/2019 | Oh et al. |
| 2019/0287985 | A1* | 9/2019 | Shimojo ............ H10B 43/35 |
| 2020/0105783 | A1* | 4/2020 | Baek ............ H01L 21/76897 |
| 2020/0119031 | A1* | 4/2020 | Shen ............ H10B 41/35 |
| 2020/0144178 | A1 | 5/2020 | Patlolla et al. |
| 2020/0235001 | A1 | 7/2020 | Tu et al. |
| 2020/0411542 | A1 | 12/2020 | Yang et al. |
| 2021/0036001 | A1 | 2/2021 | Kim et al. |

\* cited by examiner

SEMICONDUCTOR DEVICES AND DATA STORAGE SYSTEMS INCLUDING THE SAME

CROSS-REFERENCE TO RELATED APPLICATION(S)

This application claims benefit of priority under 35 U.S.C. § 119 to Korean Patent Application No. 10-2021-0062809 filed on May 14, 2021, in the Korean Intellectual Property Office, the disclosure of which is incorporated herein by reference in its entirety.

BACKGROUND

The present disclosure relates to a semiconductor device and a data storage system including the same.

A semiconductor device which may store high-capacity data has been used as a data storage system for data storage. Accordingly, a method of increasing the data storage capacity of a semiconductor device has been researched. For example, as one method for increasing the data storage capacity of a semiconductor device, a semiconductor device including memory cells arranged three-dimensionally, rather than memory cells arranged two-dimensionally, has been suggested.

SUMMARY

Example embodiments provide a semiconductor device having improved reliability and productivity.

Example embodiments provide a data storage system including a semiconductor device having improved reliability and productivity.

According to an example embodiment, a semiconductor device includes: a first structure including a substrate, circuit devices on the substrate, and lower contacts and lower interconnections electrically connected to the circuit devices; and a second structure on the first structure. The second structure includes: a conductive plate layer; a stack structure disposed on the conductive plate layer and having a memory cell region and a through-insulating region adjacent to the memory cell region, the stack structure including gate electrodes disposed in the memory cell region, sacrificial insulating layers disposed in the through-insulating region, and interlayer insulating layers disposed between the gate electrodes and between the sacrificial insulating layers; separation regions penetrating through the gate electrodes of the stack structure in a vertical direction; channel structures penetrating through the gate electrodes of the stack structure in the vertical direction, each of the channel structures including a channel layer electrically connected to the conductive plate layer; through-contact plugs penetrating through the sacrificial insulating layers of the stack structure to be connected to the lower interconnections of the first structure; and an upper interconnection structure on the channel structures and the through-contact plugs. The upper interconnection structure includes: bitlines extending lengthwise in a second direction, perpendicular to the first direction; first contacts disposed between the bitlines and the channel layers to electrically connect the bitlines and the channel layers to each other on the memory cell region; second contacts disposed between the bitlines and the through-contact plugs to electrically connect the bitlines and the through-contact plugs to each other on the through-insulating region; and dummy contacts disposed between the second contacts and connected to the bitlines, on the through-insulating region.

According to an example embodiment, a semiconductor device includes: a first structure including a substrate, circuit devices on the substrate, and a lower interconnection structure electrically connected to the circuit devices; and a second structure on the first structure. The second structure includes: a conductive plate layer; gate electrodes spaced apart from each other on the conductive plate layer in a vertical direction and extending lengthwise in a first direction; separation regions penetrating through the gate electrodes in the vertical direction and extending lengthwise in the first direction; channel structures penetrating through the gate electrodes in the vertical direction and respectively including a channel layer electrically connected to the conductive plate layer; through-contact plugs spaced apart from the gate electrodes and extending in the vertical direction to be electrically connected to the lower interconnection structure of the first structure; first contacts respectively electrically connected to the channel layer on the channel structures; second contacts respectively electrically connected to the through-contact plugs on the through-contact plugs; bitlines electrically connecting at least one of the first contacts, arranged in a second direction perpendicular to the first direction and at least one of the second contacts to each other, the bitlines extending lengthwise in the second direction; and dummy contacts connected to the bitlines and spaced apart from the through-contact plugs. Upper surfaces of the first contacts, upper surfaces of the second contacts, and upper surfaces of the dummy contacts are in contact with the bitlines.

According to an example embodiment, a data storage device includes: a semiconductor storage device including a first structure including a substrate, circuit devices on the substrate, and a lower interconnection structure electrically connected to the circuit devices, a second structure on the first structure, and an input/output pad electrically connected to the circuit devices; and a controller electrically connected to the semiconductor storage device through the input/output pad and configured to control the semiconductor storage device. The second structure includes: a conductive plate layer; gate electrodes spaced apart from each other on the conductive plate layer in a vertical direction and extending lengthwise in a first direction; separation regions penetrating through the gate electrodes in the vertical direction and extending lengthwise in the first direction; channel structures penetrating through the gate electrodes in the vertical direction and respectively including a channel layer electrically connected to the conductive plate layer; through-contact plugs spaced apart from the gate electrodes and extending in the vertical direction to be electrically connected to the lower interconnection structure of the first structure; first contacts respectively electrically connected to the channel layer on the channel structures; second contacts respectively electrically connected to the through-contact plugs on the through-contact plugs; bitlines electrically connecting at least one of the first contacts, arranged in a second direction, perpendicular to the first direction, and at least one of the second contacts to each other and extending lengthwise in the second direction; and dummy contacts connected to the bitlines and spaced apart from the through-contact plugs. Upper surfaces of the first contacts, upper surfaces of the second contacts, and upper surfaces of the dummy contacts are in contact with the bitlines.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1:
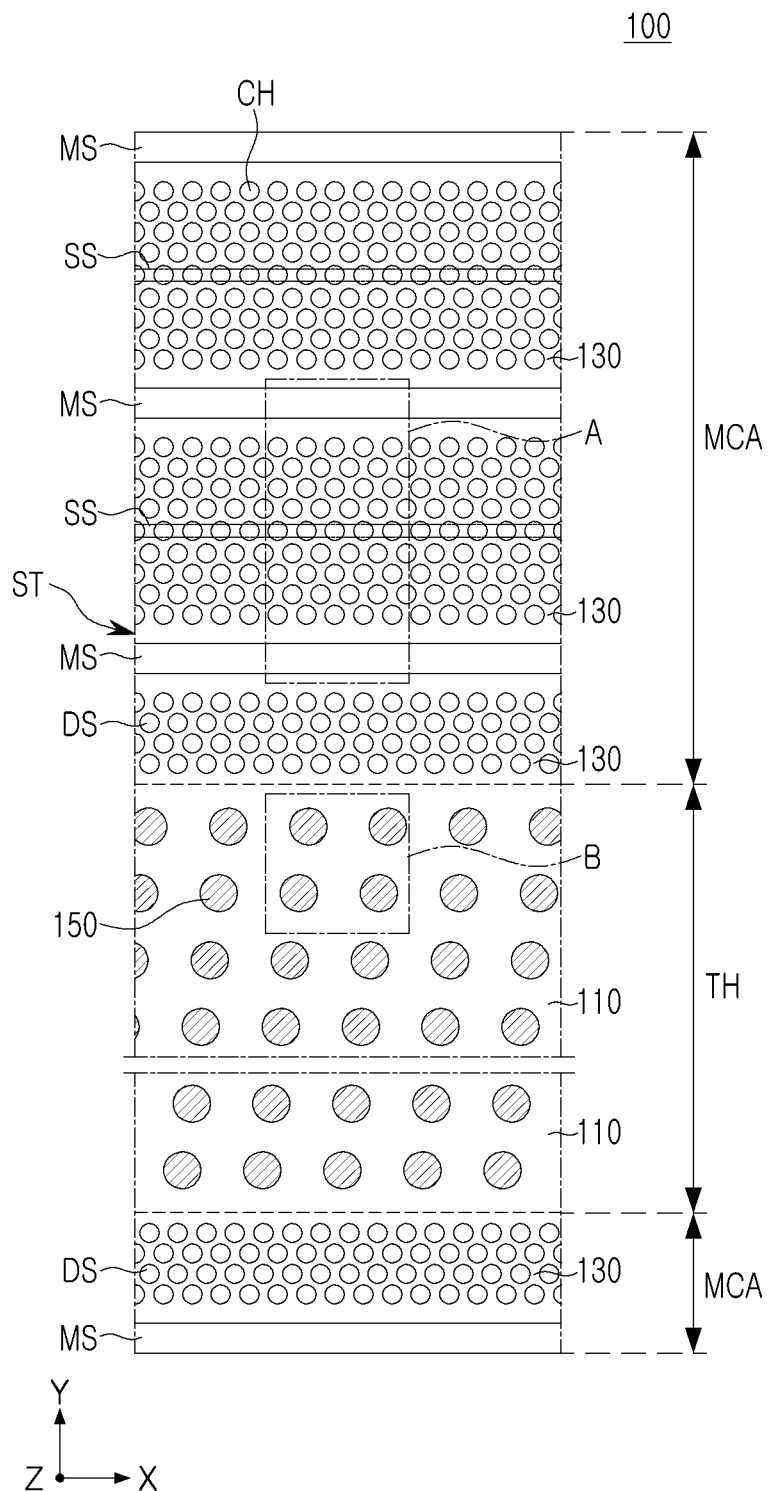
FIG. 1 is a schematic plan view of a semiconductor device, according to example embodiments.

Hereinafter, example embodiments will be described with reference to the accompanying drawings. In the drawings, like numerals refer to like elements throughout. As used herein, terms such as "same," "equal," "planar," or "coplanar" encompass near identicality including variations that may occur, for example, due to manufacturing processes. The term "substantially" may be used herein to emphasize this meaning, unless the context or other statements indicate otherwise. The term "contact," as used herein, refers to a direct connection (i.e., touching) unless the context indicates otherwise.

FIG. 1 is a schematic plan view of a semiconductor device, according to example embodiments.

Figure 2:
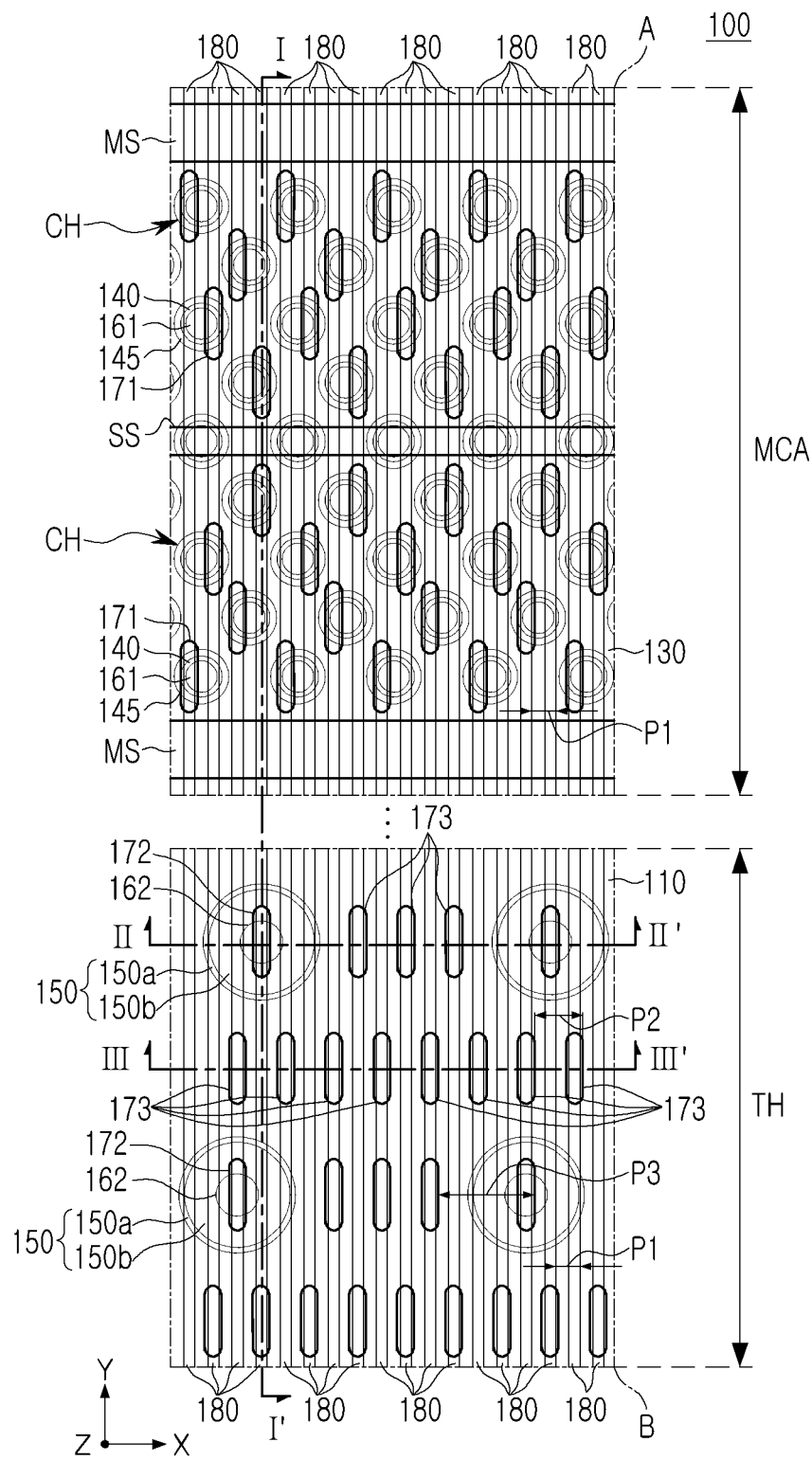
FIG. 2 is a partially enlarged plan view of a semiconductor device, according to example embodiments.

FIG. 2 is a partially enlarged plan view of a semiconductor device, according to example embodiments. FIG. 2 is an enlarged view of regions "A" and "B" of FIG. 1.

Figure 3A:
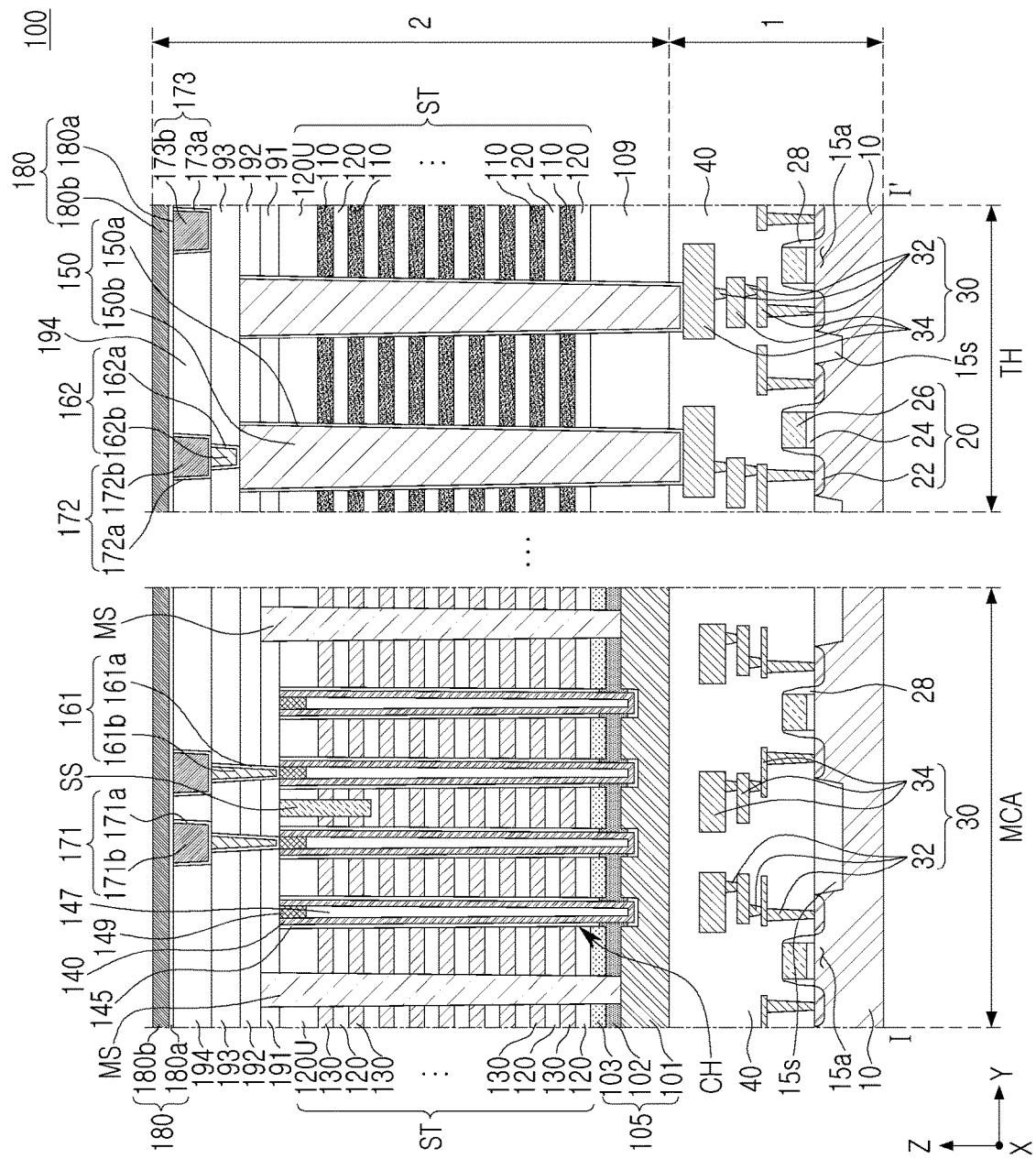
FIGS. 3A and 3B are schematic cross-sectional views of a semiconductor device, according to example embodiments.
Figure 3B:
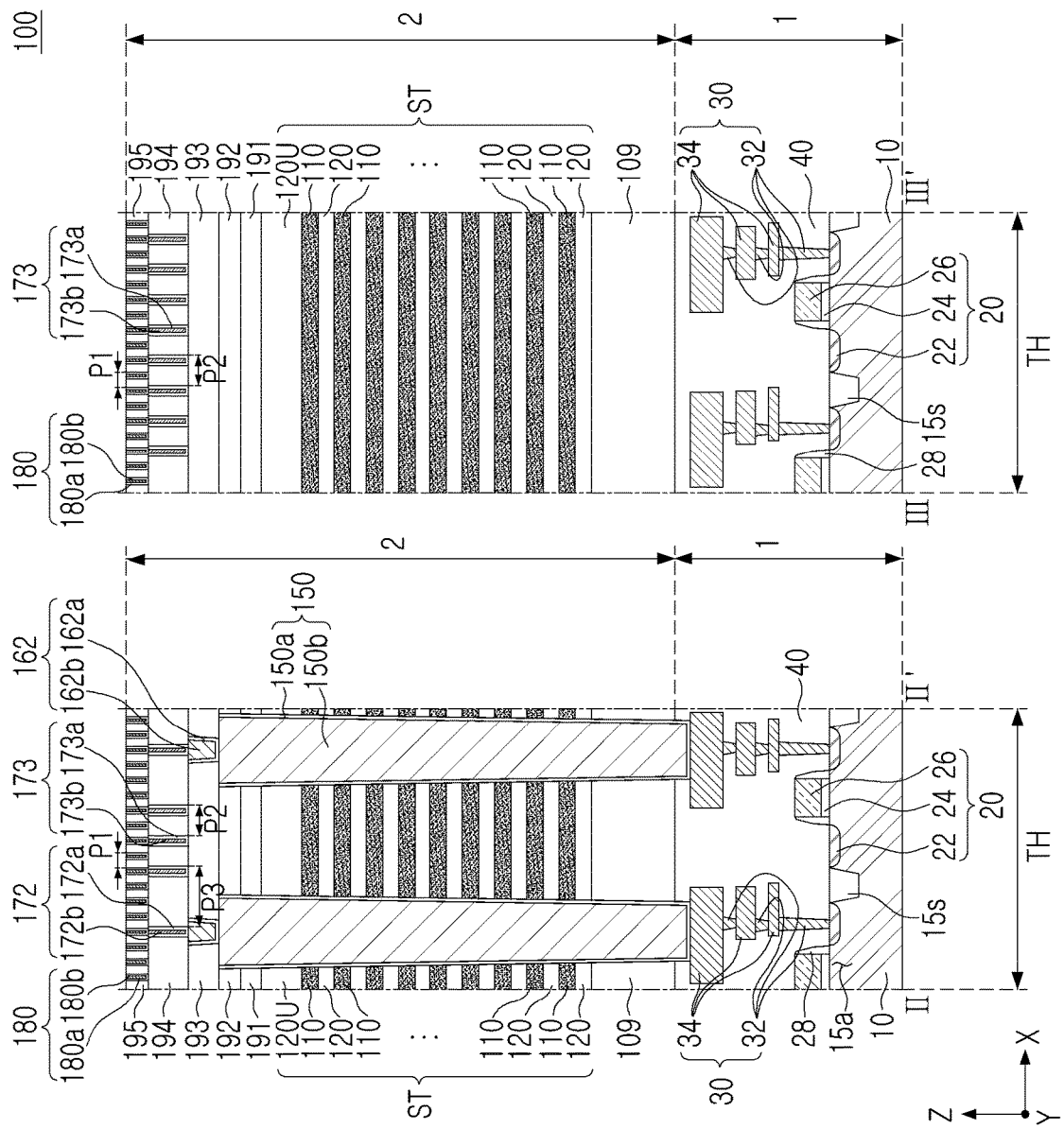

FIGS. 3A and 3B are schematic cross-sectional views of a semiconductor device, according to example embodiments. FIG. 3A illustrates a cross-section taken along line I-I' crossing regions "A" and "B" of FIG. 2, and FIG. 3B illustrates cross-sections taken along lines II-II' and III-III' of FIG. 2.

Referring to FIGS. 1 to 3C, a semiconductor device 100 may include a first structure 1 including a substrate 10 and a second structure 2 including a pattern structure 105. The second structure 2 may be disposed on the first structure 1. The first structure 1 may be a region in which a peripheral circuit region of the semiconductor device 100 is disposed, and the peripheral circuit region may include a row decoder, a page buffer, other peripheral circuits, and the like. The second structure 2 may be a region in which memory cells of the semiconductor device 100 are disposed, and the memory cells may include gate electrodes 130, channel layers 140, and the like.

The first structure 1 may include a substrate 10, device isolation layers 15s defining an active region 15a on the substrate 10, circuit devices 20 disposed on the substrate 10, a lower interconnection structure 30 electrically connected to the circuit devices 20, and a lower capping insulating layer 40.

The substrate 10 may include a semiconductor material, for example, a group IV semiconductor, a group III-V compound semiconductor, or a group II-VI compound semiconductor. The substrate 10 may be provided as a bulk wafer or an epitaxial layer. The device isolation layers 15s may be disposed in the substrate 10, and source/drain regions 22 including impurities may be disposed in a portion of the active region 15a.

Each of the circuit devices 20 may include a transistor including a source/drain region 22, a circuit gate dielectric layer 24, and a circuit gate electrode 26. The source/drain regions 22 may be disposed on opposite sides adjacent to the circuit gate electrode 26 in the active region 15a. The circuit gate dielectric layer 24 may be disposed between the active region 15a and the circuit gate electrode 26. Spacer layers 28 may be disposed on both sidewalls of the circuit gate electrode 26. The circuit gate electrode 26 may include, for example, a material layer such as tungsten (W), titanium (Ti), tantalum (Ta), tungsten nitride (WN), titanium nitride (TiN), tantalum nitride (TaN), polycrystalline silicon, or a metal-semiconductor compound.

The lower interconnection structure 30 may be electrically connected to the circuit devices 20. The lower interconnection structure 30 may include lower contacts 32 and lower interconnections 34. A portion of the lower contacts 32 may extend in a Z direction to be connected to the source/drain regions 22. The lower contact 32 may electrically connect the lower interconnections 34, disposed on different levels, to each other. The lower interconnection structure 30 may include a conductive material, for example, a metal material such as tungsten (W), titanium (Ti), tantalum (Ta), copper (Cu), aluminum (Al), molybdenum (Mo), and ruthenium (Ru). A barrier layer, formed of a metal nitride such as tungsten nitride (WN) or titanium nitride (TiN), may be disposed on a bottom surface and a side surface of the lower interconnection structure 30. The number of layers and the arrangement of the lower contacts 32 and the lower interconnection 34, constituting the lower interconnection structure 30, may vary according to example embodiments. At least some of the lower interconnections 34 may include a pad layer to which a plurality of through-contact plugs 150 extending downwardly from the second structure 2 are directly connected.

The lower capping insulating layer 40 may be disposed to cover the substrate 10, the circuit devices 20, and the lower interconnection structure 30. The capping insulating layer 40 may be formed of an insulating material such as silicon oxide or silicon nitride. The lower capping insulating layer 40 may include a plurality of insulating layers. The lower capping insulating layer 40 may include an etch-stop layer formed of silicon nitride.

The second structure 2 may include a stack structure ST including a pattern structure 105 on the first structure 1, gate electrodes 130 on the pattern structure 105, sacrificial insulating layers 110, separation regions MS penetrating through the stack structure ST and separating the gate electrodes 130, channel structures CH penetrating through the stack structure ST and respectively including a channel layer 140, through-contact plugs 150 penetrating through a through-insulating region TH of the stack structure ST, and an upper interconnection structure on the channel structures CH and the through-contact plugs 150. The upper interconnection structure may include first studs 161, second studs 162, first contacts 171, second contacts 172, dummy contacts 173, and bitlines 180. The second structure 2 may further include a lower through-insulating layer 109, interlayer insulating layers 120 stacked alternately with the gate electrodes 130 and the sacrificial insulating layers 110 and constituting a portion of the stack structure ST, an upper separation region SS penetrating through some of the gate electrodes 130, a dummy vertical structure DS, and upper insulating layers 191, 192, 193, 194, and 195.

The pattern structure 105 may be disposed on the first structure 1. The stack structure ST may be disposed on the pattern structure 105. At least a portion of the pattern structure 105 may be formed of, for example, polycrystalline silicon having N-type conductivity. In the pattern structure 105, a region formed of polycrystalline silicon having N-type conductivity may be a common source region. In example embodiments, the pattern structure 105 may include a conductive plate layer 101, a first pattern layer 102 on the conductive plate layer 101, and a second pattern layer 103. At least one of the conductive plate layer 101, the first pattern layer 102, and the second pattern layer 103 may include silicon. In example embodiments, the pattern structure 105 may include a single layer, for example, a silicon layer.

The lower through-insulating layer 109 may be disposed to penetrate through some regions of the pattern structure 105. The lower through-insulating layer 109 may be disposed in a region in which a portion of the pattern structure 105 is removed, and may be disposed to be surrounded by the pattern structure 105. The lower through-insulating layer 109 may have an upper surface, substantially coplanar with an upper surface of the second pattern layer 103, and a lower surface substantially coplanar with a lower surface of the conductive plate layer 101 or disposed on a lower level than a lower surface of the conductive plate layer 101. The lower through-insulating layer 109 may include an insulating material, for example, at least one of silicon oxide, silicon nitride, and silicon oxynitride.

The stack structure ST may include a memory cell region MCA and a through-insulating region TH. The memory cell region MCA may be a region in which the gate electrodes 130 are spaced apart from each other and stacked in a Z direction and the channel structures CH are disposed. The through-insulating region TH may be a region in which the through-contact plugs 150 vertically pass through the stack structure ST. For example, as illustrated in FIG. 3A, the through-contact plugs 150 may penetrate through the sacrificial insulating layers 110 and the interlayer insulating layers 120 of the stack structure ST to be electrically connected to the lower interconnection structure 30 of the first structure 1 in the through-insulating region TH. As illustrated in FIG. 1, the through-insulating region TH may be disposed adjacent to the memory cell region MCA in a Y direction. The through-insulating region TH may extend lengthwise in an X direction between the separation regions MS. In the through-insulating region TH, at least one insulating layer surrounding at least a portion of side surfaces of the through-contact plugs 150, for example, the interlayer insulating layers 120 and the sacrificial insulating layers 110 between the interlayer insulating layers 120 may be disposed.

The gate electrodes 130 may be spaced apart from each other and stacked on the pattern structure 105 in the Z direction in the memory cell region MCA to constitute a portion of the stack structure ST. The gate electrodes 130 may extend lengthwise in the X direction. The gate electrodes 130 may include lower gate electrodes constituting a gate of a ground select transistor, memory gate electrodes constituting a plurality of memory cells, and upper gate electrodes constituting gates of string select transistors. The number of the memory gate electrodes constituting the plurality of memory cells may be determined depending on the capacity of the semiconductor device 100. In example embodiments, the gate electrodes 130 may further include gate electrodes disposed above the upper gate electrodes and/or below the lower gate electrode, forming an erase transistor used in an erase operation using a gate induced drain leakage (GIDL) phenomenon.

The gate electrodes 130 may be vertically spaced apart from each other and stacked on the pattern structure 105. Although not illustrated, the gate electrodes 130 may extend lengthwise by different lengths in the Y direction to form a staircase-shaped step structure. The gate electrodes 130 may have pad regions in which an underlying gate electrode 130 extends further than overlying gate electrode 130 to be exposed upwardly, and gate contact plugs may be disposed on the pad regions.

The gate electrodes 130 may be disposed to be separated from each other in the Y direction by the separation region MS extending lengthwise in the X direction. The gate electrodes 130 between a pair of separation regions MS may constitute a single memory block, but the scope of the memory block is not limited thereto. Each of the gate electrodes 130 may include a first layer and a second layer. The first layer may cover an upper surface and a lower surface of the second layer, and may extend between the channel structure CH and the second layer. The first layer may include a high-k dielectric material such as aluminum oxide (AlO), and the second layer may include at least one of titanium (Ti), titanium nitride (TiN), tantalum (Ta), tantalum nitride (TaN), tungsten (W), and tungsten nitride (WN). According to example embodiments, the gate electrodes 130 may include polycrystalline silicon or a metal-semiconductor compound.

The sacrificial insulating layers 110 may be disposed on substantially the same levels as the gate electrodes 130 in the through-insulating region TH, and may electrically insulate the gate electrodes 130 from the through-contact plugs 150. The sacrificial insulating layers 110 may include an insulating material such as silicon nitride. Side surfaces of the sacrificial insulating layers 110 may be in contact with side surfaces of the gate electrodes 130 at the boundary of the through-insulating region TH. In a process of removing the sacrificial insulating layers 110 through a separation openings ('OP' of FIG. 15), a portion of the sacrificial insulating layers 110 may be removed and remain in the through-insulating region TH.

The interlayer insulating layers 120 may be disposed between the gate electrodes 130, and may constitute the stack structure ST. The interlayer insulating layers 120 may be disposed between the gate electrodes 130 in the memory cell region MCA and may extend to the through-insulating region TH to be disposed between the sacrificial insulating layers 110. Similarly to the gate electrodes 130, the interlayer insulating layers 120 may be disposed to be spaced apart from each other in the Z direction and to extend lengthwise in the X direction. The interlayer insulating layers 120 may include an insulating material such as silicon oxide. Among the interlayer insulating layers 120, an uppermost interlayer insulating layer 120U may have a thickness greater than a thickness of each of the other interlayer insulating layers 120. Some of the interlayer insulating layers 120 may have different thicknesses.

The separation regions MS may be disposed to extend lengthwise in the X direction through the gate electrodes 130. The separation regions MS may be disposed to be parallel to each other. The separation regions MS may penetrate through the entirety of gate electrodes 130 of the stack structure ST in the Z direction to be connected to the pattern structure 105. For example, lower surfaces of the separation regions MS may be coplanar with a lower surface of the first pattern layer 102, and may contact an upper surface of the conductive plate layer 101. The separation regions MS may be formed of an insulating material, for example, silicon oxide. According to example embodiments, each of the separation regions MS may include a plurality of insulating layers, or may include a core pattern including a conductive material and a separation pattern covering side surfaces and bottom surfaces of the core pattern and including an insulating material.

The upper separation regions SS may extend lengthwise in the X direction between the separation regions MS. The upper separation regions SS may separate some of the upper gate electrodes 130 among the gate electrodes 130 from each other in the Y direction. However, the number of the gate electrodes 130 separated by the upper separation regions SS may vary according to example embodiments. The upper gate electrodes 130 separated by the upper separation regions SS may constitute different string select lines. The upper separation regions SS may include an insulating material, for example, silicon oxide, silicon nitride, or silicon oxynitride.

As illustrated in FIG. 1, the channel structures CH may each constitute a single memory cell string, and may be disposed to be spaced apart from each other in rows and columns in the memory cell region MCA. The channel structures CH may be disposed to constitute a grid pattern, or may be disposed in a zigzag pattern in one direction. Each of the channel structures CH may have a columnar shape, and may have an inclined side surface of which a width decreases in a direction toward the pattern structure 105 depending on an aspect ratio.

A channel layer 140 may be disposed in the channel structures CH. In the channel structures CH, the channel layer 140 may be formed in an annular shape surrounding a core insulating layer 147 disposed therein. For example, the channel layer 140 may cover and contact side and bottom surface of the core insulating layer 147. The channel layer 140 may be in contact with the first pattern layer 102 in a lower portion thereof, and may be electrically connected to the conductive plate layer 101. For example, a side surface of the channel layer 140 may contact a side surface of the first pattern layer 102. The channel layer 140 may include a semiconductor material such as polycrystalline silicon or single-crystalline silicon.

A channel pad 149 may be disposed on the channel layer 140 in the channel structures CH. The channel pad 149 may be disposed to cover an upper surface of the core insulating layer 147 and to be electrically connected to the channel layer 140. The channel pad 149 may contact the upper surface of the core insulating layer 147 and an inner side surface of the channel layer 140. The channel pad 149 may include, for example, doped polycrystalline silicon. The channel pad 149 may include a semiconductor material such as polycrystalline silicon or single-crystalline silicon, for example, doped polycrystalline silicon.

A gate dielectric layer 145 may be disposed between the gate electrodes 130 and the channel layer 140. The gate dielectric layer 145 may contact side surfaces of the gate electrodes 130 and the channel layer 140. The gate dielectric layer 145 may include a tunneling layer, a data storage layer, and a blocking layer sequentially stacked from the channel layer 140. The tunneling layer may be configured to tunnel charges to the data storage layer, and may include, for example, silicon oxide ($SiO_2$), silicon nitride ($Si_3N_4$), silicon oxynitride (SiON), or combinations thereof. The data storage layer may be configured as a charge trap layer or a floating gate conductive layer. The blocking layer may include oxide ($SiO_2$), silicon nitride ($Si_3N_4$), silicon oxynitride (SiON), a high-k dielectric material, or combinations thereof. In example embodiments, at least a portion of the gate dielectric layer 145 may extend in a horizontal direction along the gate electrodes 130.

As illustrated in FIG. 3A, the channel structures CH penetrate through the gate electrodes 130 of the stack structure ST in the Z direction, and may penetrate through the first pattern layer 102 and the second pattern layer 103 in the Z direction to partially extend inwardly of the conductive plate layer 101. The first pattern layer 102 may penetrate through the gate dielectric layer 145 below the stack structure ST to be in contact with the channel layer 140. The first pattern layer 102 may be directly connected to the channel layer 140 at a periphery of the channel layer 140.

As illustrated in FIG. 1, the dummy vertical structure DS may be disposed between the through-insulating region TH and the separation region MS in a region, adjacent to the through-insulating region TH, of the memory cell region MCA. The dummy vertical structures DS may be disposed to be spaced apart from each other in rows and columns, similarly to the channel structures CH, and may be disposed to form a grid pattern or disposed in a zigzag pattern in one direction. The dummy vertical structure DS may have a structure the same as or similar to a structure of the channel structure CH, but may not perform a substantial function in the semiconductor device 100. In example embodiments, the dummy vertical structure DS may have a structure different from a structure of the channel structure CH and an interior thereof may be formed of, for example, an insulating material such as silicon oxide. Among the channel structures CH, a structure disposed to overlap the upper separation region SS may be a dummy channel structure.

As illustrated in FIGS. 1 and 2, the through-contact plugs 150 may be spaced apart from each other in the through-insulating region TH. The through-contact plugs 150 may penetrate through the lower through-insulating layer 109 and the through-insulating region TH and of the stack structure ST in the Z direction to be electrically connected to the lower interconnection structure 30 of the first structure 1. The through-contact plugs 150 may be connected to an uppermost lower interconnection 34 among the lower interconnections 34. The through-contact plugs 150 may be spaced apart from and insulated from the gate electrodes 130 by the sacrificial insulating layers 110. Each of the through-contact plugs 150 may have a columnar shape, and may have an inclined side surface of which a width decreases in a direction toward the substrate 10 depending on an aspect ratio. The through-contact plugs 150 may electrically connect the circuit devices 20 of the first structure 1 and the channel layer 140 of the channel structures CH of the second structure 2 to each other.

The first studs 161 may be disposed between the channel structures CH and the first contacts 171. The first studs 161 may be connected to the channel pads 149 of the channel structures CH on the memory cell region MCA, respectively. The first studs 161 may be connected to the first contacts 171 disposed on the first studs 161, and may be electrically connected to the bitlines 180. The first studs 161 may penetrate through at least one of the upper insulating layers 191, 192, 193, 194, and 195, for example, the first to third upper insulating layers 191, 192, and 193 in the Z direction. For example, upper surfaces of the first studs 161 may be coplanar with an upper surface of the third upper insulating layer 193, and lower surfaces of the first studs 161 may be coplanar with a lower surface of the first upper insulating layer 191. According to example embodiments, a plurality of studs may be disposed between a single channel structure CH and a single first contact 171.

The second studs 162 may be disposed between the through-contact plugs 150 and the second contacts 172. The second studs 162 may be connected to the through-contact plugs 150 on the through-insulating region TH, respectively. The second studs 162 may be connected to the second contacts 172 and may be electrically connected to the bitlines 180. The second studs 162 may penetrate through at least one of the upper insulating layers 191, 192, 193, 194, and 195, for example, the third upper insulating layer 193 in the Z direction. For example, upper surfaces of the second studs 162 may be coplanar with an upper surface of the third upper insulating layer 193, and lower surfaces of the first studs 161 may be coplanar with a lower surface of the third upper insulating layer 193.

The first contacts 171 may be connected to the first studs 161 and the bitlines 180 on the memory cell region MCA. The first contacts 171 may be disposed between the first studs 161 and the bitlines 180 and between the channel layers 140 and the bitlines 180. The first contacts 171 may electrically connect the bitlines 180 and the channel layer 140 to each other. The first contacts 171 may penetrate through the fourth upper insulating layer 194 in the Z direction. For example, upper and lower surfaces of the first contacts 171 may be coplanar with upper and lower surfaces, respectively, of the fourth upper insulating layer 194. Upper surfaces of the first contacts 171 may be in contact with the bitlines 180. The first contacts 171 may be arranged in a zigzag pattern.

The second contacts 172 may be connected to the second studs 162 and the bitlines 180 on the through-insulating region TH. The second contacts 172 may be disposed between the second studs 162 and the bitlines 180 and between the through-contact plugs 150 and the bitlines 180. The second contacts 172 may electrically connect the bitlines 180 and the through-contact plugs 150 to each other. The second contacts 172 may penetrate through the fourth upper insulating layer 194 in the Z direction. For example, upper and lower surfaces of the second contacts 172 may be coplanar with upper and lower surfaces, respectively, of the fourth upper insulating layer 194. Upper surfaces of the second contacts 172 may be in contact with the bitlines 180. The second contacts 172 may be disposed at a lower arrangement density than the first contacts 171. The term "arrangement density" may refer to a degree to which patterns are arranged to be dense in one region of a plane. A distance between the first contacts 171 closest to each other may be smaller than a distance between the second contacts 172 closest to each other.

The dummy contacts 173 may be disposed side by side with the second contacts 172 between the second contacts 172 on the through-insulating region TH, and may be connected to the bitlines 180. For example, the dummy contacts 173 may be disposed between the second contacts 172 in the X direction and between the second contacts 172 in the Y direction. The dummy contacts 173 may be disposed on substantially the same level as the second contacts 172. For example, the dummy contacts 173 may penetrate through the fourth upper insulating layer 194 in the Z direction. In example embodiments, upper and lower surfaces of the dummy contacts 173 may be coplanar with upper and lower surfaces, respectively, of the fourth upper insulating layer 194. The dummy contacts 173 may be spaced apart from the through-contact plugs 150 and the second studs 162. The dummy contacts 173 may be disposed on the through-insulating region TH so as not to overlap the through-contact plugs 150 in the Z direction. Lower regions of the dummy contacts 173 may be surrounded by an insulating material forming at least one of the upper insulating layers 191, 192, 193, 194, and 195. For example, lower surfaces of the dummy contacts 173 may completely contact the third upper insulating layer 193, or lower regions including lower surfaces of the dummy contacts 173 may be surrounded by an insulating material forming the third upper insulating layer 193. Upper surfaces of the dummy contacts 173 may be in contact with the bitlines 180.

The dummy contacts 173 may be arranged at a second pitch P2, an integer multiple of the first pitch P1 of the bitlines 180. The second pitch P2 may be, for example, about two times or more and about four times or less of the first pitch P1. The dummy contacts 173 and the second contacts 172 may be arranged at a third pitch P3 greater than or equal to about third times and less than or equal to about five times the first pitch P1. The third pitch P3 may be greater than the second pitch P2. However, a pitch at which the dummy contacts 173 are arranged is not limited to the above range. For example, the arrangement pitch of the dummy contacts 173 may vary within a range in which the arrangement density of the first contacts 171 may be similar to the arrangement density of a structure of the second contacts 172 and the dummy contacts 173.

The bitlines 180 may extend lengthwise in the Y direction on the first and second contacts 171 and 172 and the dummy contacts 173. The bitlines 180 may extend over the entire region on the memory cell region MCA and the through-insulating region TH. Each of the bitlines 180 may electrically connect at least one of the first contacts 171 and at least one of the second contacts 172 arranged in the Y direction to each other. The bitlines 180 may be arranged at the first pitch P1 constant in the X direction. Each of the bitlines 180 may include a barrier layer 180a and conductive pattern 180b. The barrier layer 180a may contact bottom and side surfaces of the conductive pattern 180b.

Each of the elements, constituting the upper interconnection structure, may include a conductive pattern and a barrier layer covering a side surface and a bottom surface of the conductive pattern. For example, the through-contact plugs 150, the first studs 161, the second studs 162, the first contacts 171, the second contacts 172, and the dummy contacts 173 may include barrier layers 150a, 161a, 162a, 171a, 172a, and 173a and conductive patterns 150b, 161b, 162b, 171b, 172b, and 173b, respectively. The barrier layers 150a, 161a, 162a, 171a, 172a, and 173a may contact side and bottom surfaces of the respective conductive patterns 150b, 161b, 162b, 171b, 172b, and 173b. Each of the barrier layers 150a, 161a, 162a, 171a, 172a, and 173a may include, for example, at least one of titanium (Ti), titanium nitride (TiN), tantalum (Ta), and tantalum nitride (TaN). Each of the conductive patterns 150b, 161b, 162b, 171b, 172b, and 173b may include a metal material, for example, at least one of tungsten (W), titanium (Ti), copper (Cu), aluminum (Al), and alloys thereof.

The upper insulating layers 191, 192, 193, 194, and 195 may be disposed on the stack structure ST. The upper interconnection structure may be disposed on the upper insulating layers 191, 192, 193, 194, and 195. The upper insulating layers 191, 192, 193, 194, and 195 may include a first upper insulating layer 191, a second upper insulating layer 192, a third upper insulating layer 193, a fourth upper insulating layer 194, and a fifth upper insulating layer 195 sequentially stacked on the stack structure ST. The upper insulating layers 191, 192, 193, 194, and 195 may be formed of an insulating material such as silicon oxide.

Figure 4:
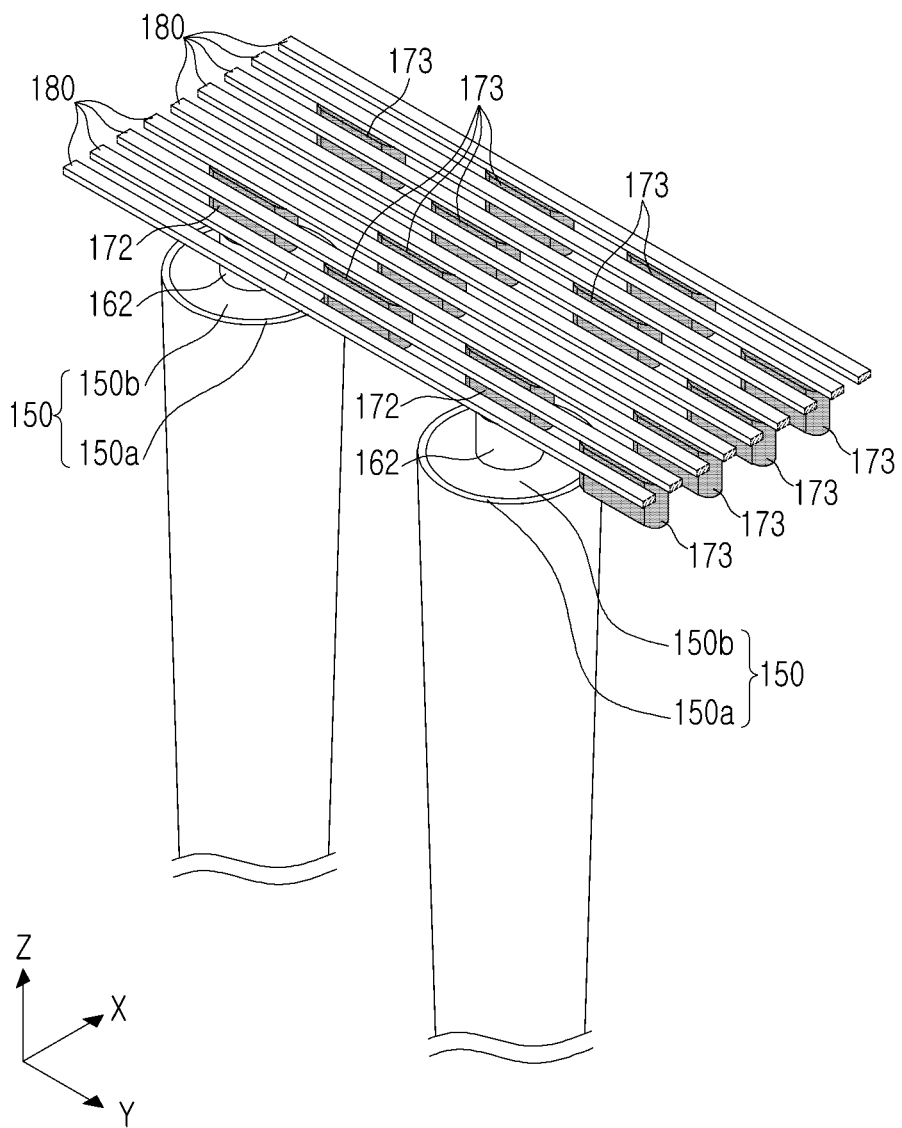
FIG. 4 is a perspective view illustrating some elements of a semiconductor device, according to example embodiments.

FIG. 4 is a perspective view illustrating some elements of a semiconductor device according to example embodiments. FIG. 4 is a perspective view corresponding to a portion of region "B" of the semiconductor device of FIG. 2. In FIG. 4, through-contact plugs 150 and the upper interconnection structure are illustrated, but the other elements are not illustrated for simplicity of description.

Referring to FIG. 4, the second contacts 172 may be electrically connected to the through-contact plugs 150 through the second studs 162, and the second studs 162 and the through-contact plugs 150 may not be disposed below dummy contacts 173. Since the dummy contact 173 is spaced apart from the through-contact plug 150 but the second contact 172 and the dummy contact 173 spaced apart from each other in the Y direction are connected to each other through an overlying bitline 180, the dummy contact 173 may also be electrically connected to the through-contact plugs 150.

Figure 5A:
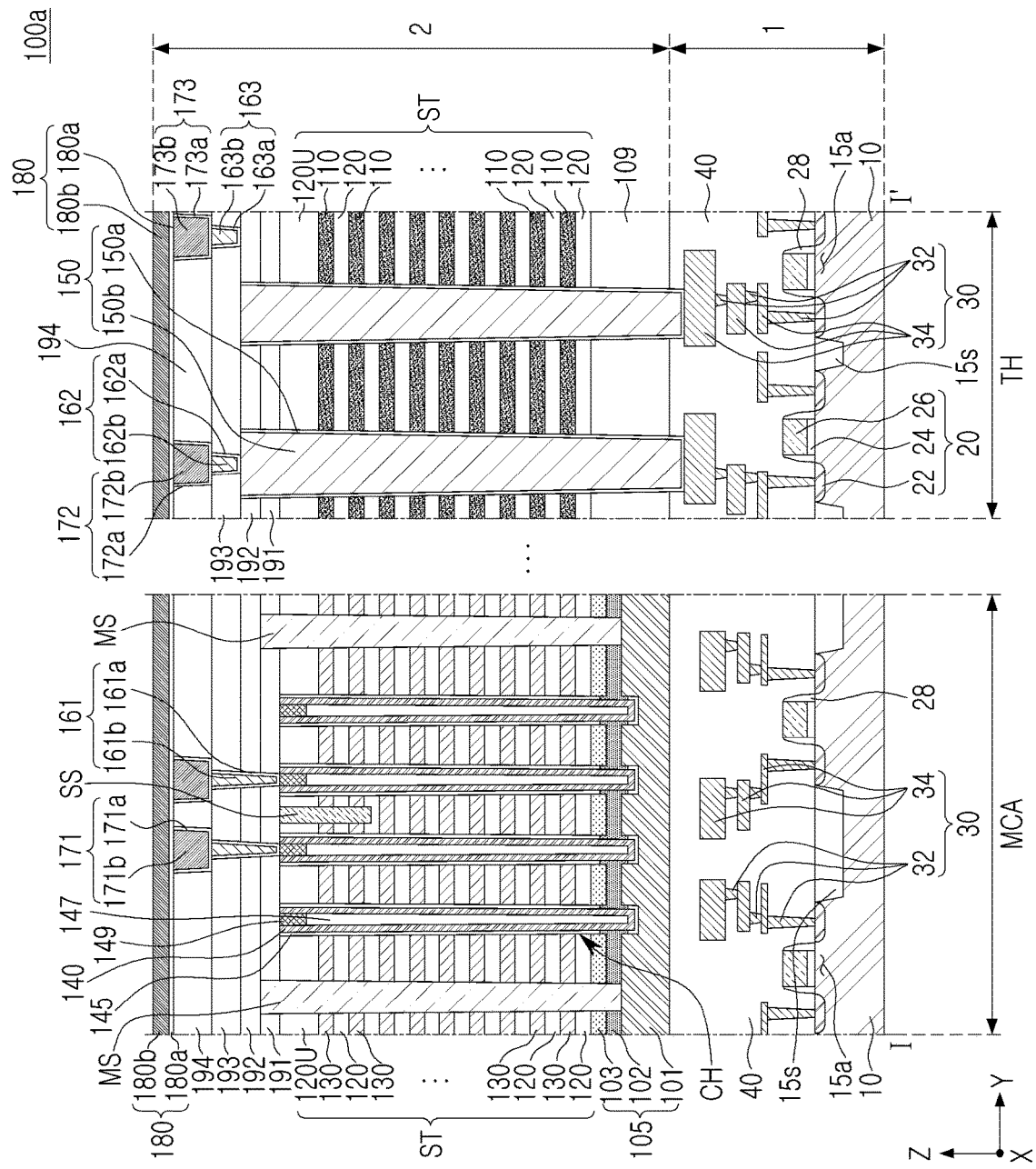
FIGS. 5A and 5B are schematic cross-sectional views of a semiconductor device, according to example embodiments.
Figure 5B:
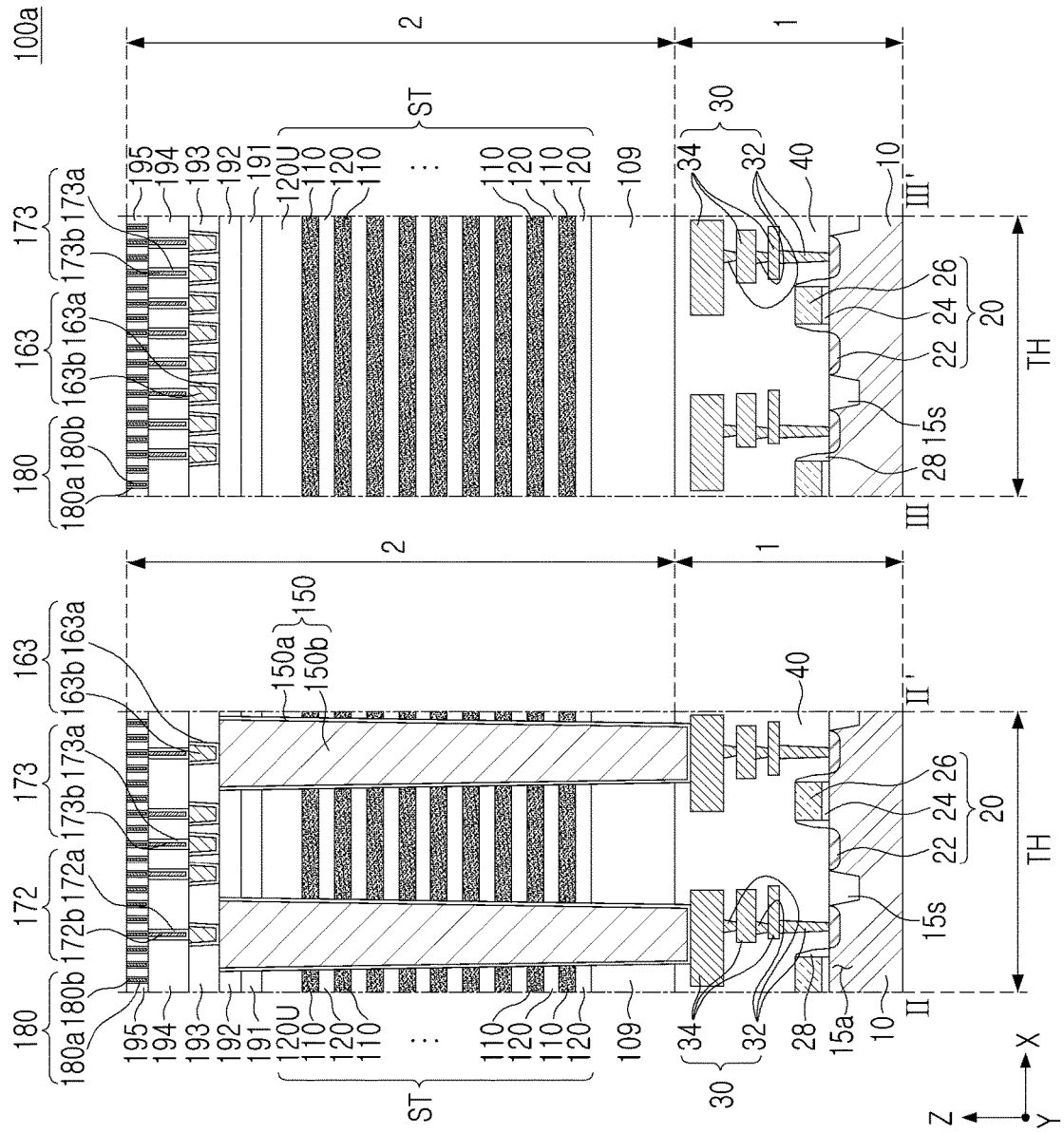

FIGS. 5A and 5B are schematic cross-sectional views of a semiconductor device according to example embodiments. FIG. 5A corresponds to a cross-section taken along line I-I' crossing regions "A" and "B" of FIG. 2, and FIG. 5B corresponds to cross-sections taken along lines II-II' and III-III' of FIG. 2.

Referring to FIGS. 5A and 5B, in a semiconductor device 100a, a second structure 2 may further include dummy studs 163 connected to lower regions of dummy contacts 173 on a through-insulating region TH. The dummy studs 163 may be disposed between second studs 162 and may be spaced apart from the second studs 162 and through-contact plugs 150. The dummy studs 163 may be electrically connected to bitlines 180 through the dummy contacts 173. The dummy studs 163 may penetrate through at least one insulating layer, among upper insulating layers 191, 192, 193, 194, and 195, for example, the third upper insulating layer 193 in a Z direction. In example embodiments, the dummy studs 163 may penetrate through the third upper insulating layer 193 in the Z direction. For example, upper and lower surfaces of the dummy studs 163 may be coplanar with upper and lower surfaces, respectively, of the third upper insulating layer 193. Each of the dummy studs 163 may include a barrier layer 163a and a conductive pattern 163b. The barrier layer 163a may contact bottom and side surfaces of the conductive pattern 163b.

Figure 6:
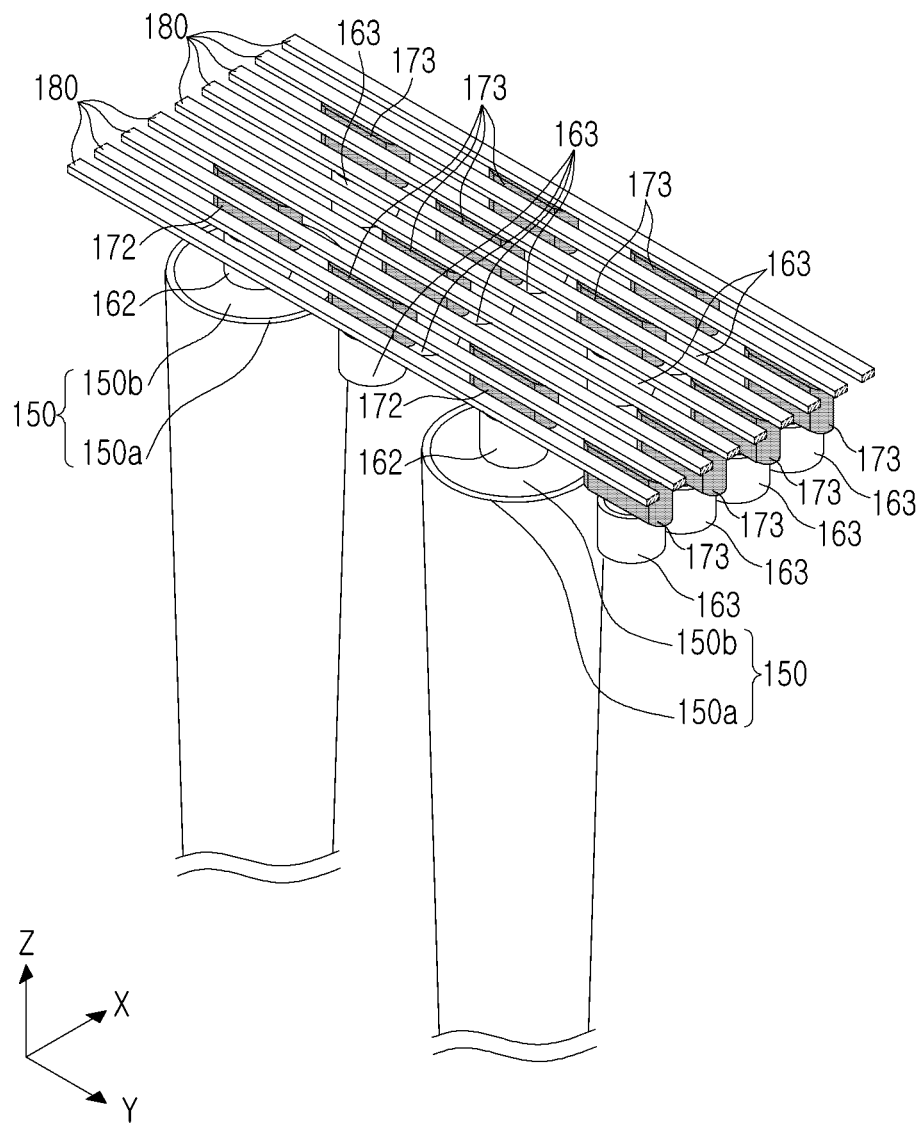
FIG. 6 is a perspective view illustrating some elements of a semiconductor device, according to example embodiments.

FIG. 6 is a perspective view illustrating some elements of a semiconductor device according to example embodiments. FIG. 6 is a perspective view corresponding to a portion of region "B" of the semiconductor device of FIG. 2. In FIG. 6, through-contact plugs 150 and the upper interconnection structure are illustrated but the other elements are not illustrated for simplicity of description.

Referring to FIG. 6, second contacts 172 may be electrically connected to the through-contact plugs 150 through second studs 162, and the through-contact plugs 150 may not be disposed below dummy contacts 173 and dummy studs 163. Since the dummy stud 163 is spaced apart from the through-contact plug 150 but the second stud 162 and the dummy stud 163 spaced apart from each other in a Y direction are connected to each other through an overlying upper bitline 180, the dummy stud 163 may also be electrically connected to the through-contact plugs 150.

Figure 7A:
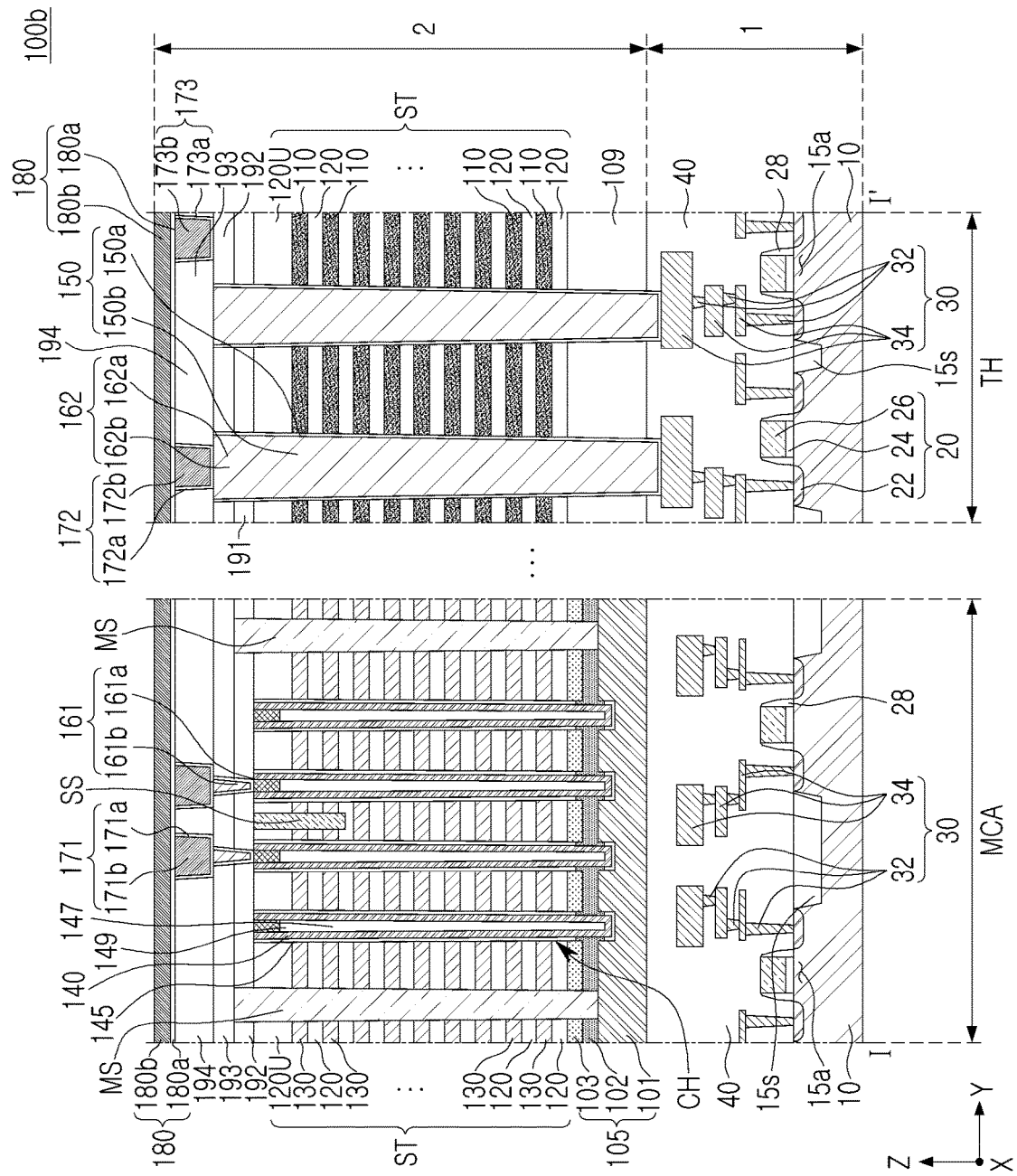
FIGS. 7A and 7B are schematic cross-sectional views of a semiconductor device, according to example embodiments.
Figure 7B:
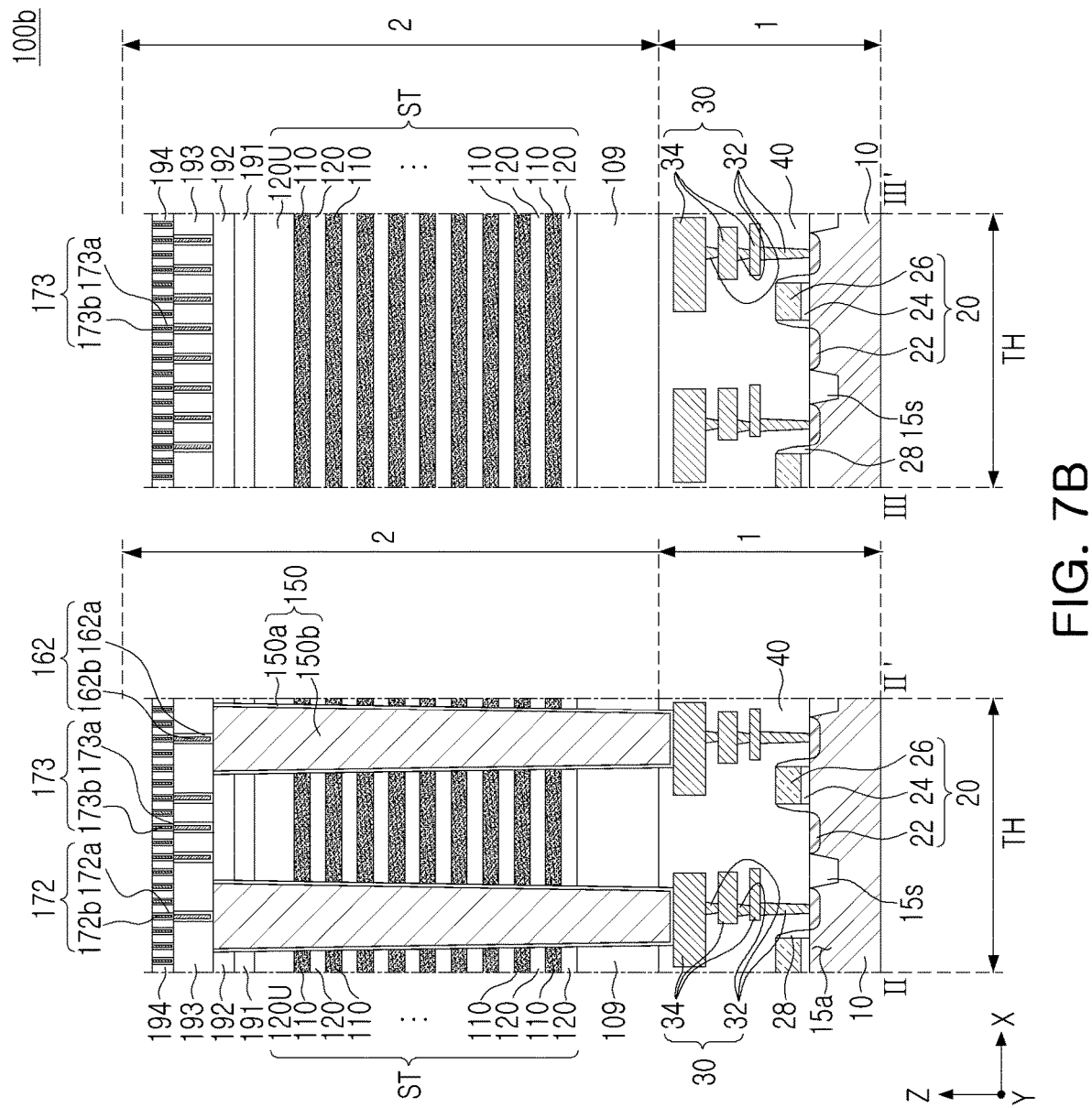

FIGS. 7A and 7B are schematic cross-sectional views of a semiconductor device according to example embodiments. FIG. 7A corresponds to a cross-section taken along line I-I' crossing regions "A" and "B" of FIG. 2, and FIG. 7B corresponds to cross-sections taken along lines II-II' and III-III' of FIG. 2.

Referring to FIGS. 7A and 7B, in a second structure 2 of a semiconductor device 100b, second contacts 172 may be in direct contact with through-contact plugs 150. The second structure 2 may include upper insulating layers 191, 192, 193, and 194, and first studs 161 may penetrate through at least one of the upper insulating layers 191, 192, 193, and 194, for example, the first and second upper insulating layers 191 and 192 in a Z direction. Lower surfaces of the dummy contacts 173 may be in full contact with the second upper insulating layer 192, or lower regions including the lower surfaces of the dummy contacts 173 may be surrounded by an insulating material forming the second upper insulating layer 192.

Figure 8:
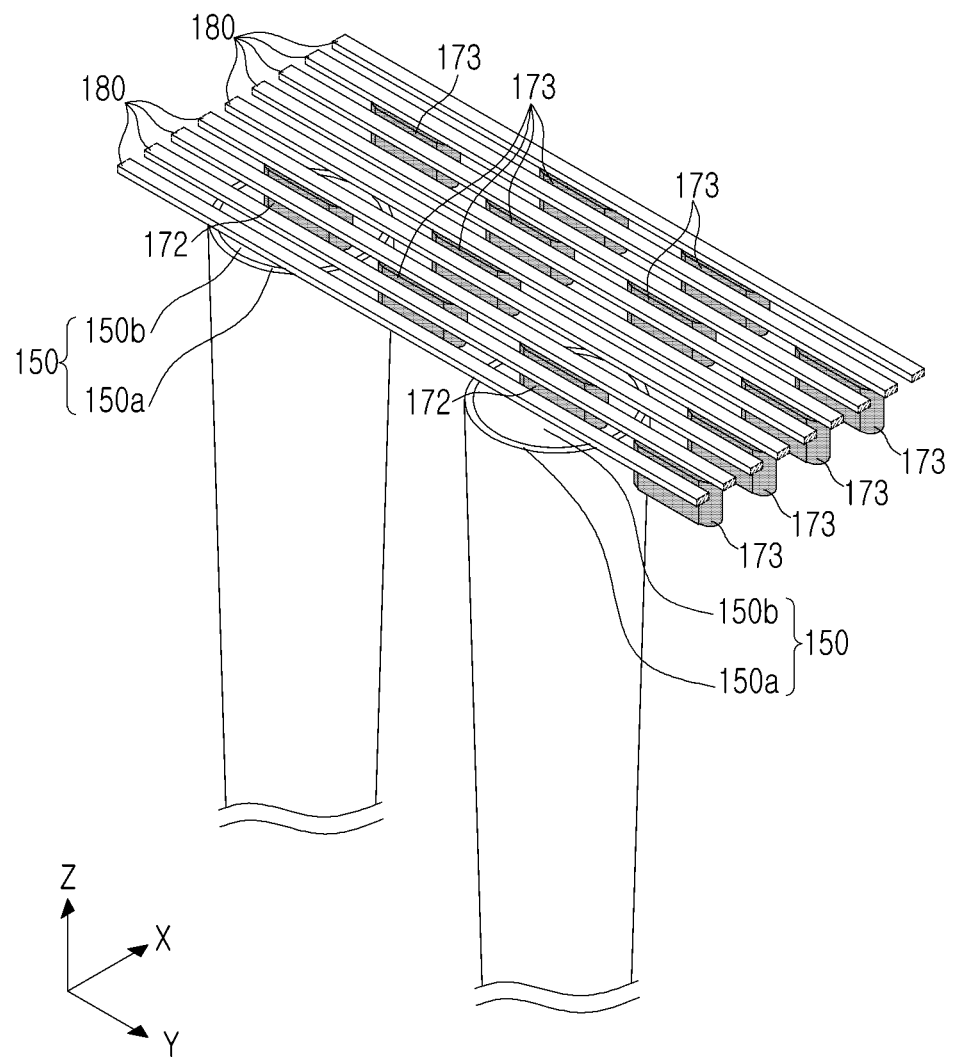
FIG. 8 is a perspective view illustrating some elements of a semiconductor device, according to example embodiments.

FIG. 8 is a perspective view illustrating some elements of a semiconductor device according to example embodiments.

Referring to FIG. 8, second contacts 172 may be in direct contact with through-contact plugs 150, and the through-contact plugs 150 may not be disposed below dummy contacts 173. Since the dummy contacts 173 are spaced apart from the through-contact plugs 150 but a second contact 172 and a dummy contact 173 are connected to each other through an overlying bitline 180, the dummy contact 173 may also be electrically connected to the through-contact plugs 150.

Figure 9A:
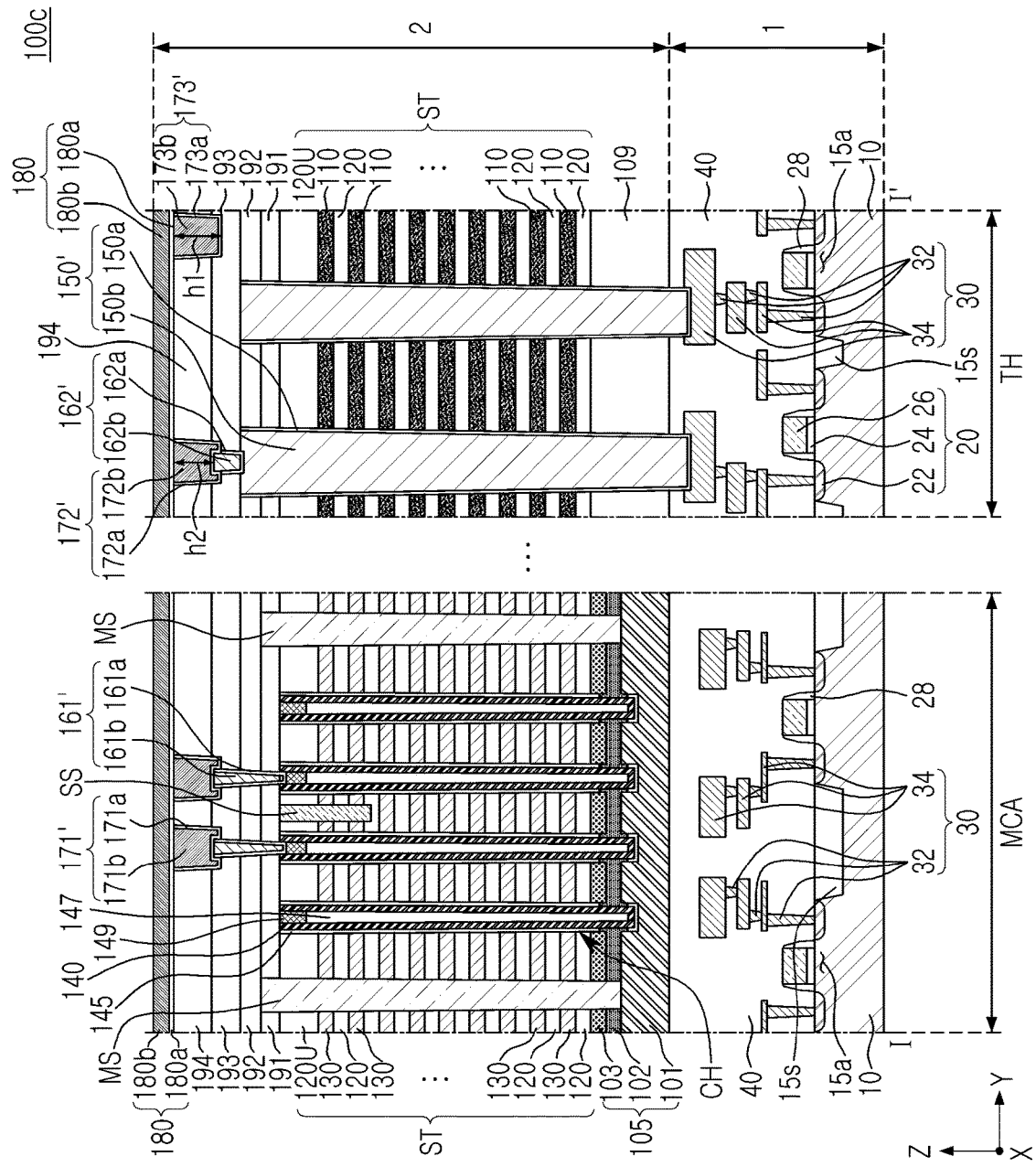
FIGS. 9A and 9B are schematic cross-sectional views of a semiconductor device, according to example embodiments.
Figure 9B:
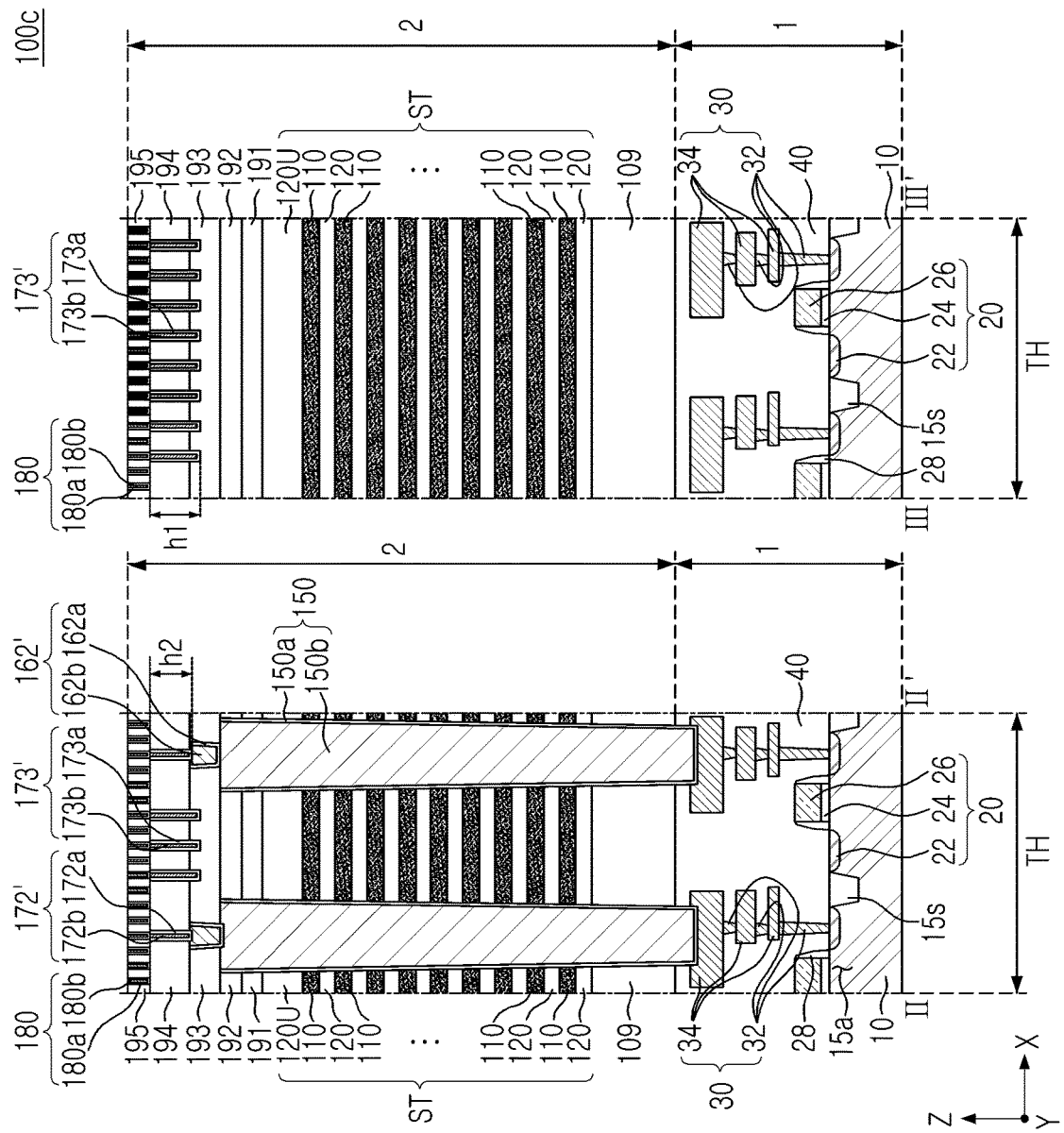

FIGS. 9A and 9B are schematic cross-sectional views of a semiconductor device according to example embodiments. FIG. 9A corresponds to a cross-section taken along line I-I' crossing regions "A" and "B" of FIG. 2, and FIG. 9B corresponds to cross-sections taken along lines II-II' and III-III' of FIG. 2.

Referring to FIGS. 9A and 9B, in a semiconductor device 100c, first studs 161' may be recessed into an upper portion of the channel pad 149, first contacts 171' may be recessed into upper portion of the first studs 161', through-contact plugs 150' may be recessed into an upper portion of an uppermost lower interconnection 34, second studs 162' may be recessed into an upper portion the through-contact plugs 150', and second contacts 172' may be recessed into an upper portion of the second studs 162'. As illustrated in FIG. 9A, the first contacts 171' and the second contacts 172' may have widths larger than widths of the first studs 161' and the second studs 162' in a Y direction, and may include portions extending downwardly along a side surface from an upper surface of each of the first studs 161' and the second studs 162'.

Lower surfaces of the dummy contacts 173' may be disposed at a lower level than a lower surface on which the first contacts 171' is in contact with the first studs 161', and may be disposed at a lower level than a lower surface on which the second contacts 172' is in contact with the second studs 162'. The lower surfaces of the dummy contacts 173' may be disposed at substantially the same level as lowermost surfaces of the first contacts 171' and lowermost surfaces of the second contacts 172'. For example, lower surfaces of the second contacts 172' may include a first portion, disposed at a first level from an upper surface of the substrate 10, and a second portion disposed at a second level from the upper surface of the substrate 10. In this case, the first level may be higher than the second level. For example, the second level may be closer to the upper surface of the substrate 10 than the first level. Lower surfaces of the dummy contacts 173' may be disposed at a lower level than the first level. The lower surfaces of the dummy contacts 173' may be disposed at substantially the same level as the second level. The first portion may be in contact with the upper surface of the second stud 162', and the second portion may be disposed at a lower level than the upper surface of the second stud 162'.

A first vertical height h1 of the dummy contacts 173' may be greater than a second vertical height h2 of a region in which the second contacts 172' overlap the second studs 162' in a Z direction. For example, the first vertical height h1 may be a vertical distance between a lower surface and an upper surface of the dummy contact 173', and the second vertical height h2 may be a vertical distance from the lower surface of the second contact 172' in contact with an upper surface of the second stud 162' to the upper surface of the second contact 172'.

In the present embodiment, as an example, a portion of a lower pattern disposed below an upper pattern is removed or recessed during an etching process in operations of fabricating the semiconductor device of FIGS. 3A and 3B. The shape and arrangement of patterns, which may be formed during an etching process, may be equivalently applied to other embodiments.

Figure 10A:
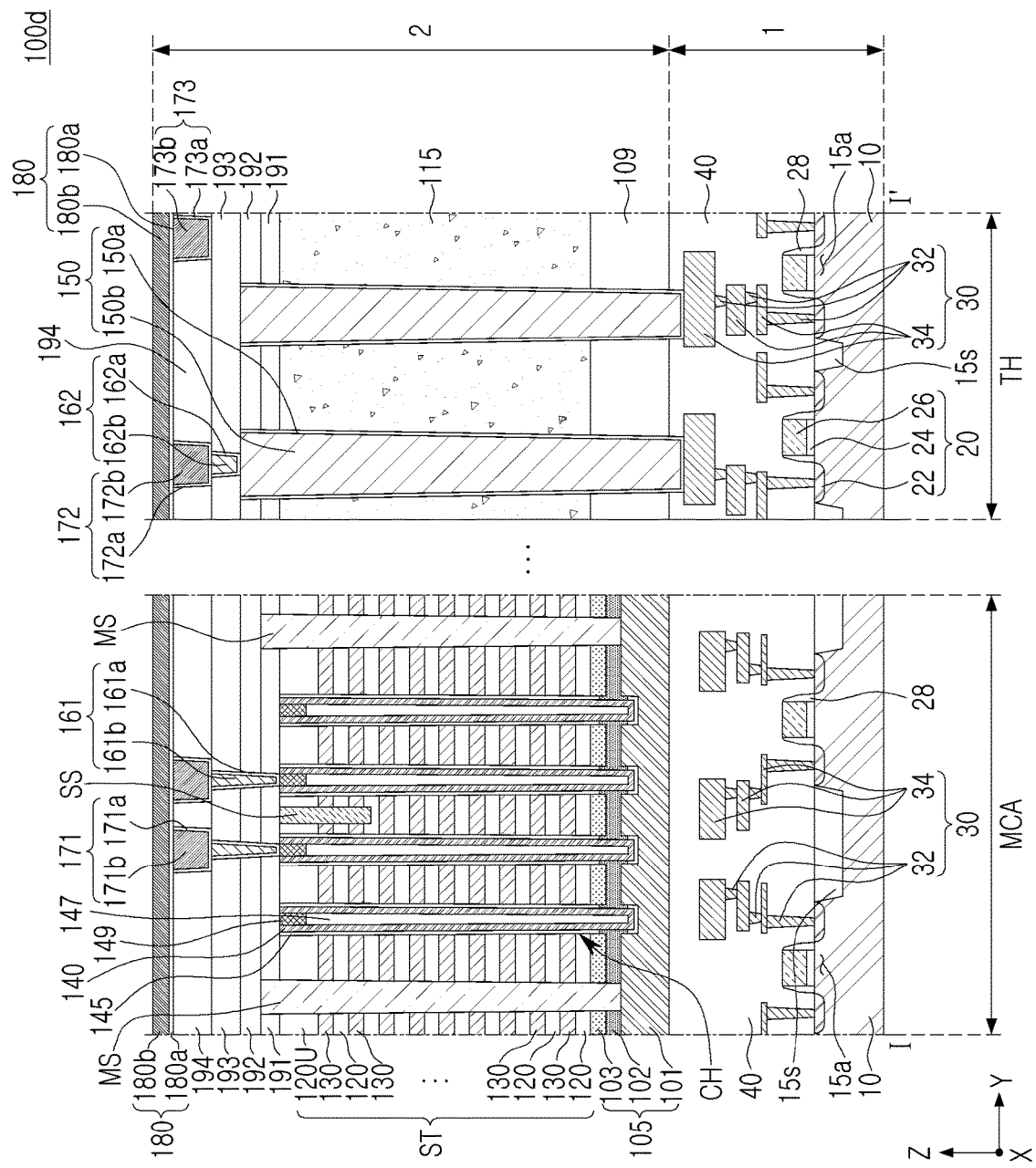
FIGS. 10A and 10B are schematic cross-sectional views of a semiconductor device, according to example embodiments.
Figure 10B:
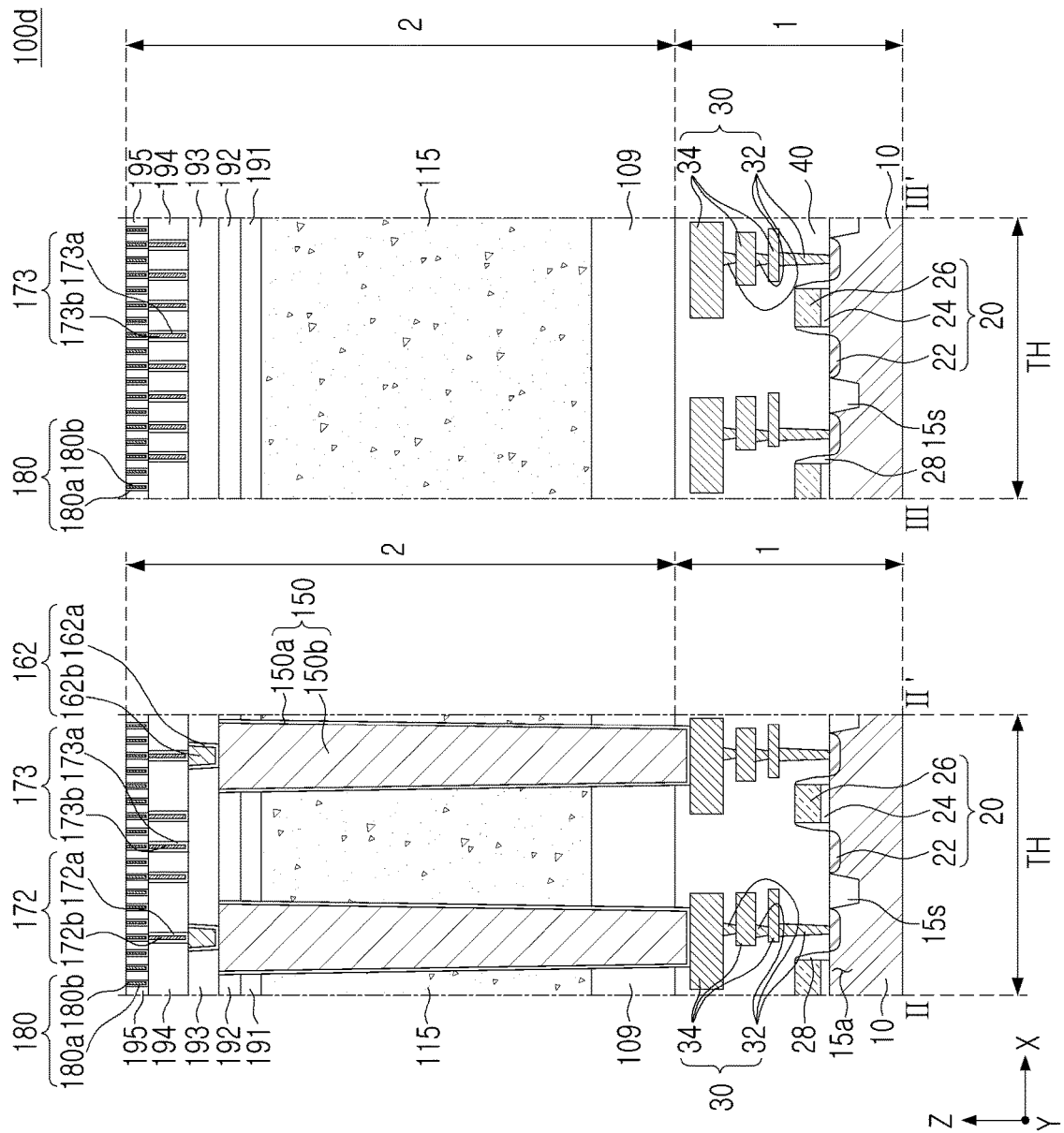

FIGS. 10A and 10B are schematic cross-sectional views of a semiconductor device according to example embodiments. FIG. 10A corresponds to a cross-section taken along line I-I' crossing regions "A" and "B" of FIG. 2, and FIG. 10B corresponds to cross-sections taken along lines II-II' and III-III' of FIG. 2.

Referring to FIGS. 10A and 10B, in a semiconductor device 100d, a stack structure ST may include a through-insulating layer 115 disposed in a through-insulating region TH. The through-insulating layer 115 may be disposed on a lower through-insulating layer 109. The through-insulating layer 115 may be formed by filling a portion of the stack structure ST (for example, a region in which the sacrificial insulating layers 110 and the interlayer insulating layers 120 are removed) with an insulating material. The through-insulating layer 115 may have a height substantially equal to or greater than a height of the stack structure ST. The through-contact plugs 150 may penetrate through the through-insulating layer 115 and the lower through-insulating layer 109 to be electrically connected to a lower interconnection structure 30 of a first structure 1. The through-insulating layer 115 may be formed of an insulating material such as silicon oxide. According to example embodiments, the through-insulating layer 115 may be formed to penetrate through a pattern structure 105 without the lower through-insulating layer 109.

Figure 11:
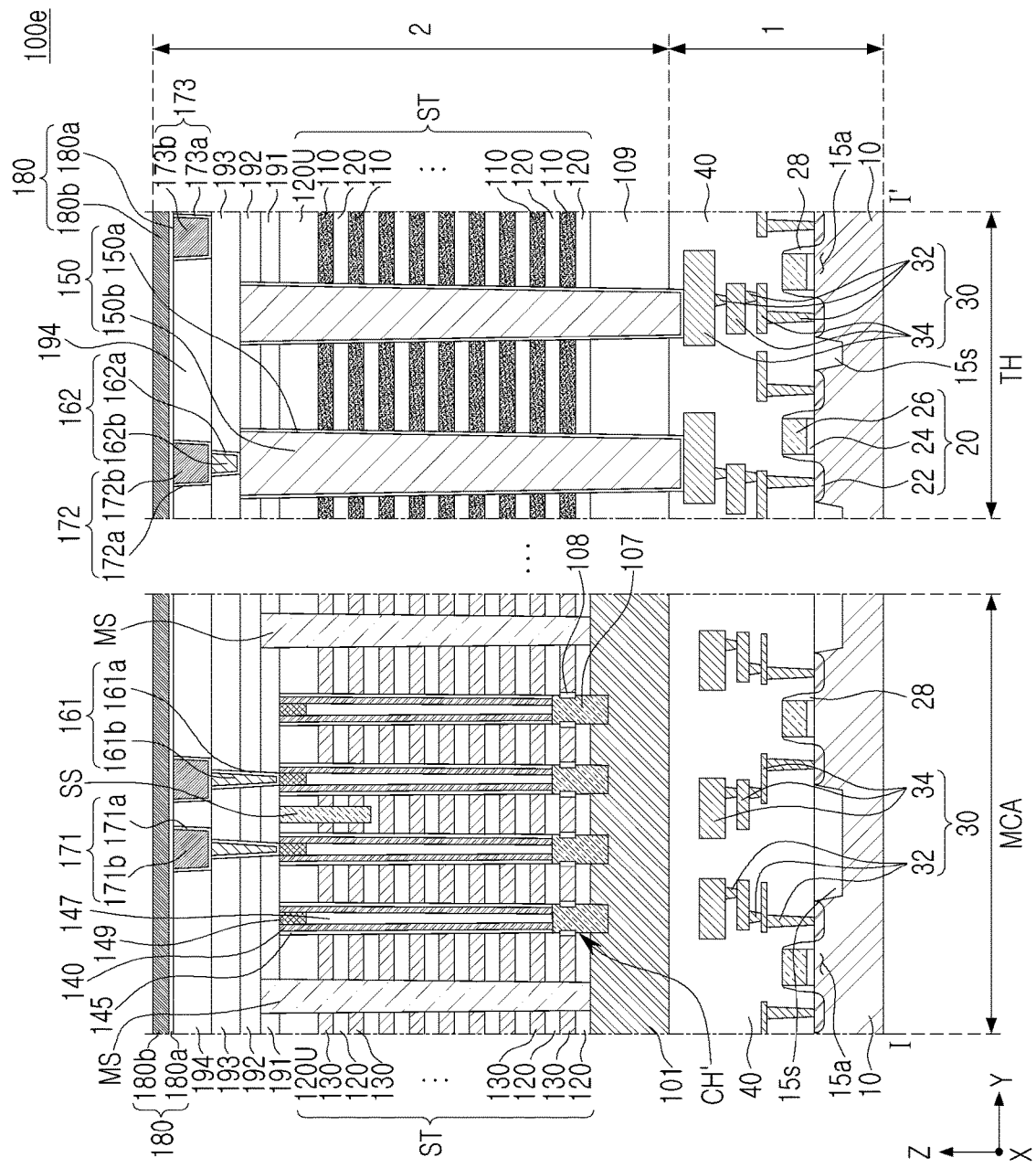
FIG. 11 is a schematic cross-sectional view of a semiconductor device, according to example embodiments.

FIG. 11 is a schematic cross-sectional view of a semiconductor device according to example embodiments. FIG. 11 corresponds to a cross-section taken along line I-I' crossing regions "A" and "B" of FIG. 2.

Referring to FIG. 11, in a semiconductor device 100e, a second structure 2 may include a conductive plate layer 101 and may not include first and second pattern layers 102 and 103. A channel structure CH' may further include an epitaxial layer 107 and a channel lower insulating layer 108.

The epitaxial layer 107 may be disposed to be in contact with a conductive plate layer 101 on a lower end of the channel structure CH', and may be disposed adjacent to a side surface of at least one gate electrode 130. The epitaxial layer 107 may be disposed in a recessed region of the conductive plate layer 101. A height of an upper surface of the epitaxial layer 107 may be larger than a height of an upper surface of a lowermost gate electrode 130 and smaller than a height of a lower surface of the upper gate electrode 130, but example embodiments are not limited thereto. The epitaxial layer 107 may be connected to the channel layer 140 through an upper surface thereof. A channel lower insulating layer 108 may be disposed between the epitaxial layer 107 and the lowermost gate electrode 130 adjacent to the epitaxial layer 107.

Figure 12:
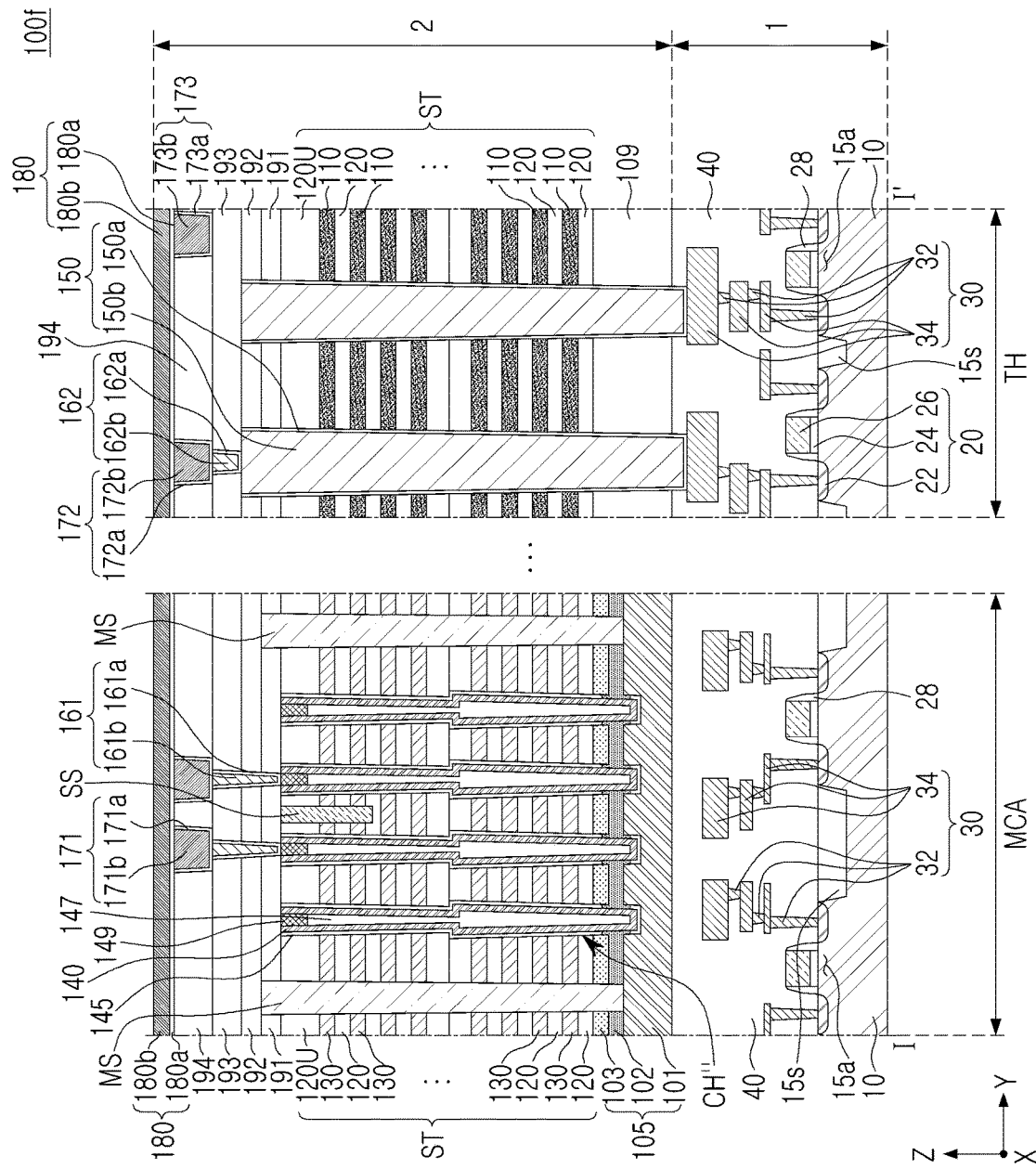
FIG. 12 is a schematic cross-sectional view of a semiconductor device, according to example embodiments.

FIG. 12 is a schematic cross-sectional view of a semiconductor device according to example embodiments. FIG. 12 corresponds to a cross-section taken along line I-I' crossing regions "A" and "B" of FIG. 2.

Referring to FIG. 12, in a semiconductor device 100f, a stack structure ST of a second structure 2 may include a lower stack structure and an upper stack structure on the lower stack structure, and a channel structure CH" may include a first channel structure, penetrating through the lower stack structure, and a second channel structure penetrating through the upper stack structure. The channel structure CH" may have a shape in which the first channel structure and the second channel structure are connected to each other, and may have a bent portion formed due to a difference in width in a connection region. In the connection region, a gate dielectric layer 145 and a channel layer 140 may each be bent. In the present embodiment, as an example, the stack structure ST may be a two-stacked structure. Example embodiments may also include an embodiment of a two or more stacked structure, that is, a multi-stack structure.

FIGS. 13A-13B, 14, 15, 16A-16B, 17A-17B, and 18A-18B are schematic cross-sectional views illustrating a method of fabricating a semiconductor device according to example embodiments.

Figure 13A:
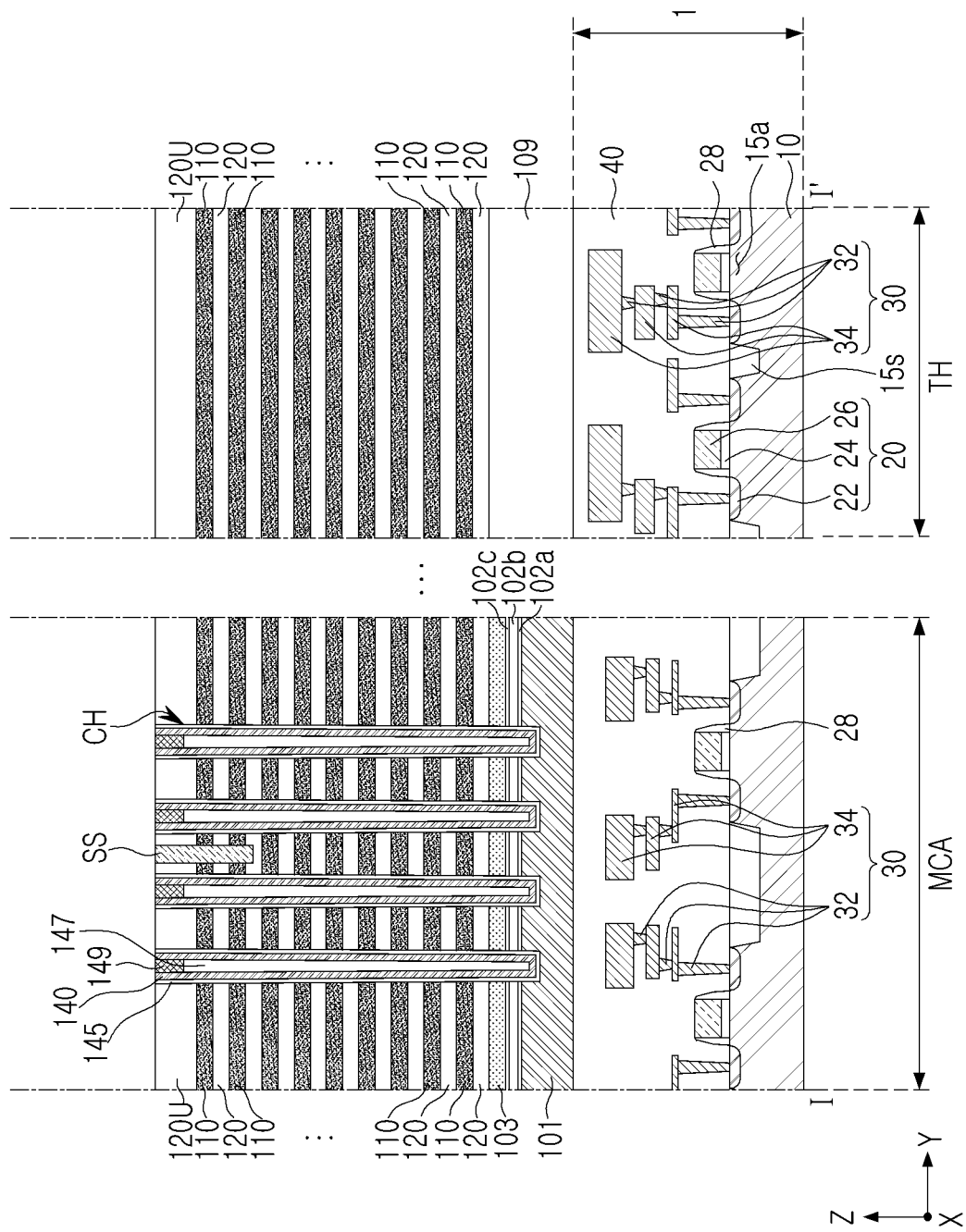
FIGS. 13A-13B, 14, 15, 16A-16B, 17A-17B, and 18A-18B are schematic cross-sectional views illustrating a method of fabricating a semiconductor device, according to example embodiments.
Figure 13B:
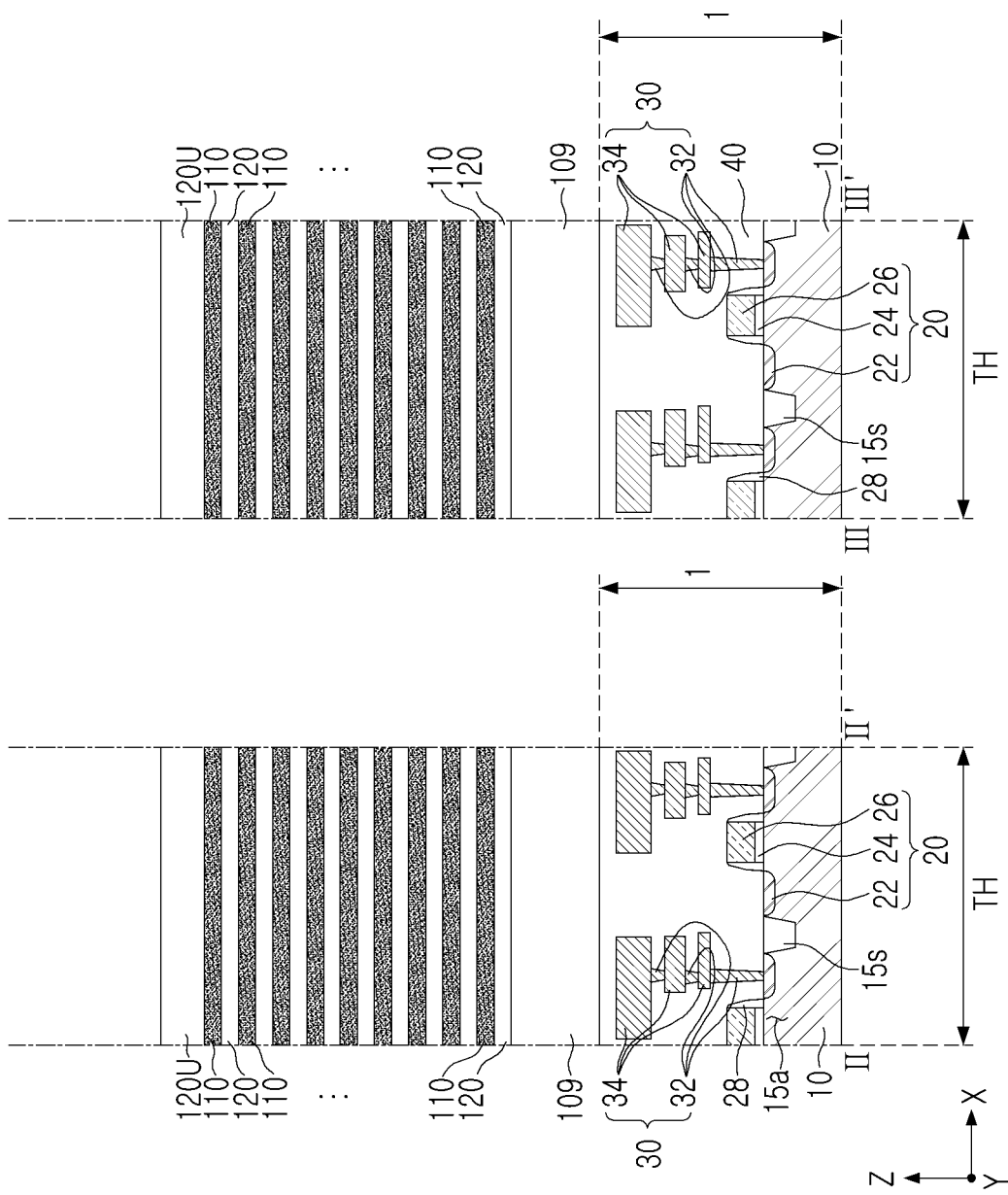

Referring to FIGS. 13A and 13B, a first structure 1 including circuit devices 20 and a lower interconnection structure 30 may be formed on a substrate 10. A conductive plate layer 101, horizontal insulating layers 102a, 102b, and 102c, a second pattern layer 103, and a lower through-insulating layer 109 may be formed on the first structure 1, and sacrificial insulating layers 110 and interlayer insulating layers may then be alternately stacked. Channel structures CH may be formed to penetrate through the sacrificial insulating layers 110 and the interlayer insulating layers 120 in a memory cell region MCA.

Device isolation layers 15s may be formed in the substrate 10, and a circuit gate dielectric layer 24 and a circuit gate electrode 26 may be sequentially formed on the active region 15a. The device isolation layers 15s may be formed by, for example, a shallow trench isolation (STI) process. The circuit gate dielectric layer 24 may be formed of silicon oxide, and the circuit gate electrode 26 may be formed of at least one of polycrystalline silicon and metal silicide, but example embodiments are not limited thereto. A spacer layer 28 may be formed on opposite sidewalls of the circuit gate dielectric layer 24 and the circuit gate electrode 26, and source/drain regions 22 may be formed in the active region 15a. According to example embodiments, the spacer layer 28 may include a plurality of layers. The source/drain regions 22 may be formed by performing an ion implantation process.

Lower contacts 32 and lower interconnections 34 of the lower interconnection structure 30 are formed by forming a portion of a lower capping insulating layer 40, etching the portion to be removed, and filling the removed portion with a conductive material. Alternatively, the lower contacts 32 and the lower interconnections 34 of the lower interconnection structure 30 may be formed by depositing a conductive material, patterning the conductive material to remove a region, and filling the removed region with a portion of the lower capping insulating layer 40.

The lower capping insulating layer 40 may include a plurality of insulating layers. A portion of the lower capping insulating layer 40 may be formed in each operation of forming the lower interconnection structure 30, and another portion of the lower capping insulating layer 40 may be formed on an uppermost lower interconnection 34. Ultimately, the lower capping insulating layer 40 may be formed to cover the circuit devices 20 and the lower interconnection structure 30.

Next, a conductive plate layer 101, sacrificial horizontal insulating layers 102a, 102b, and 102c, a second pattern layer 103, and a lower through-insulating layer 109 may be formed.

The conductive plate layer 101 and the second pattern layer 103 may be formed of, for example, polycrystalline silicon. Polycrystalline silicon forming the conductive plate layer 101 may contain impurities.

The horizontal insulating layers 102a, 102b, and 102c may include first to third horizontal insulating layers 102a, 102b, and 102c stacked on the conductive plate layer 101. Some of the horizontal insulating layers 102a, 102b, and 102c may be replaced with the first pattern layer 102 of FIG. 3A through a subsequent process. The first and third horizontal insulating layers 102a and 102c may be formed of the same material, and the second horizontal insulating layer 102b may be formed of the same material as the sacrificial insulating layers 110. Although not illustrated, the second pattern layer 103 may be bent to cover side surfaces of the horizontal insulating layers 102a, 102b, and 102c in a region, in which the horizontal insulating layers 102a, 102b, and 102c are patterned, to be in contact with the conductive plate layer 101.

The lower through-insulating layer 109 may be formed by removing some of the conductive plate layer 101, the horizontal insulating layers 102a, 102b, and 102c, and the second pattern layer 103 and filling the removed portion with an insulating material, in a region corresponding to a portion below the through-insulating region TH. After filling the removed portion with the insulating material, a planarization process may be further performed using a chemical mechanical polishing (CMP) process. Thus, an upper surface of the lower through-insulating layer 109 may be substantially coplanar with an upper surface of the second pattern layer 103.

The sacrificial insulating layers 110 may be partially replaced with gate electrodes 130 (see FIG. 3A) through a subsequent process. The sacrificial insulating layers 110 may be formed of a material different from a material of the interlayer insulating layers 120, and may be formed of a material etched with etch selectivity with respect to the interlayer insulating layers 120 under specific etching conditions. For example, the interlayer insulating layer 120 may be formed of at least one of silicon oxide and silicon nitride, and the sacrificial insulating layers 110 may be formed of a material, selected from the group consisting of silicon, silicon oxide, silicon carbide, and silicon nitride, different from the material of the interlayer insulating layer 120. In example embodiments, the interlayer insulating layers 120 may not have the same thickness. The thicknesses of the interlayer insulating layers 120 and the sacrificial insulating layers 118 and the number of layers forming the interlayer insulating layers 120 and the sacrificial insulating layers 118 may vary from the example illustrated in the views.

The sacrificial insulating layers 110 and the interlayer insulating layers 120 may be partially removed to form an upper separation region SS. The upper separation region SS may be formed by exposing a region, in which the upper separation region SS is to be formed, using an additional mask layer, removing a predetermined number of sacrificial insulating layers 110 and interlayer insulating layers 120 from an uppermost portion, and depositing an insulating material.

The channel structures CH may be formed by anisotropically etching the sacrificial insulating layers 110, the interlayer insulating layers 120, the second pattern layer 103, and the horizontal insulating layers 102a, 102b, and 102c, and may be formed by forming hole-shaped channel holes and filling the channel holes. For example, a gate dielectric layer 145 may be formed to conformally cover internal sidewalls and bottom surfaces of the channel holes, a channel layer 140 may be formed on the gate dielectric layer 145 in the channel holes, a core insulating layer 147 may be formed to fill a space between the internal sidewalls of the channel layer 140 in the channel holes, and a channel pad 149 may be formed in a region in which an upper portion of the core insulating layer 147 is partially removed. The channel structures CH may have side surfaces inclined with respect to an upper surface of the substrate 10. The channel structures CH may be formed to recess a portion of the conductive plate layer 101. The dummy vertical structures DS may be formed together with the channel structures CH.

In the present process, when an epitaxial layer 107 may be formed on lower ends of the channel structures CH by an epitaxial growth process from the conductive plate layer 101, a process of forming the horizontal insulating layers 102a, 102b, and 102c and the second pattern layer 103 and a process of forming lower openings LP and a first pattern layer 102 to be described later may be omitted. Then, the semiconductor device 100e of FIG. 11 may be fabricated through subsequent processes.

Figure 14:
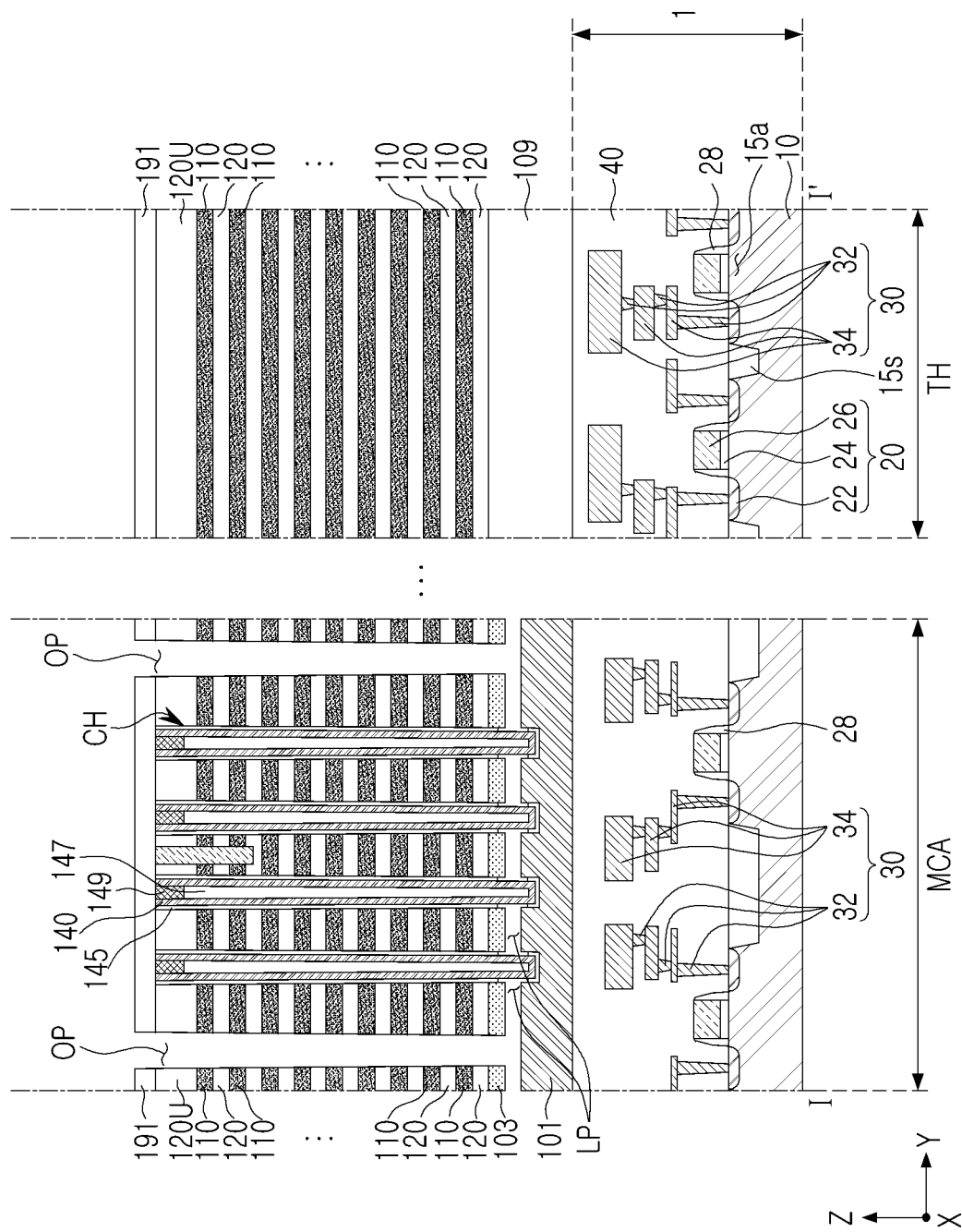

Referring to FIG. 14, separation openings OP may be formed to extend through the sacrificial insulating layers 110 and the interlayer insulating layers 120 in the X direction, and some of the horizontal insulating layer 102a, 102b, and 102c may be removed through the separation openings OP.

A first upper insulating layer 191 may be formed on an uppermost interlayer insulating layer 120U. The separation openings OP may be formed by forming a mask layer using a photolithography process and anisotropically etching the first upper insulating layer 191, the sacrificial insulating layers 110, the interlayer insulating layers 120, and the second pattern layer 103. The separation openings OP may be formed to have a trench shape extending lengthwise in an X direction.

Next, additional sacrificial spacer layers may be formed in the separation openings OP and an etch-back process may be performed to expose the second horizontal insulating layer 102b. Lower openings LP may be formed by selectively removing the second horizontal insulating layer 102b from the exposed region and then removing overlying and underlying first and third horizontal insulating layers 102a and 102c. The horizontal insulating layers 102a, 102b, and 102c may be removed by, for example, a wet etching process. During the process of removing the horizontal insulating layers 102a, 102b, and 102c, a portion of the gate dielectric layer 145 exposed in a region, in which the second horizontal insulating layer 102b is removed, may also be removed.

Figure 15:
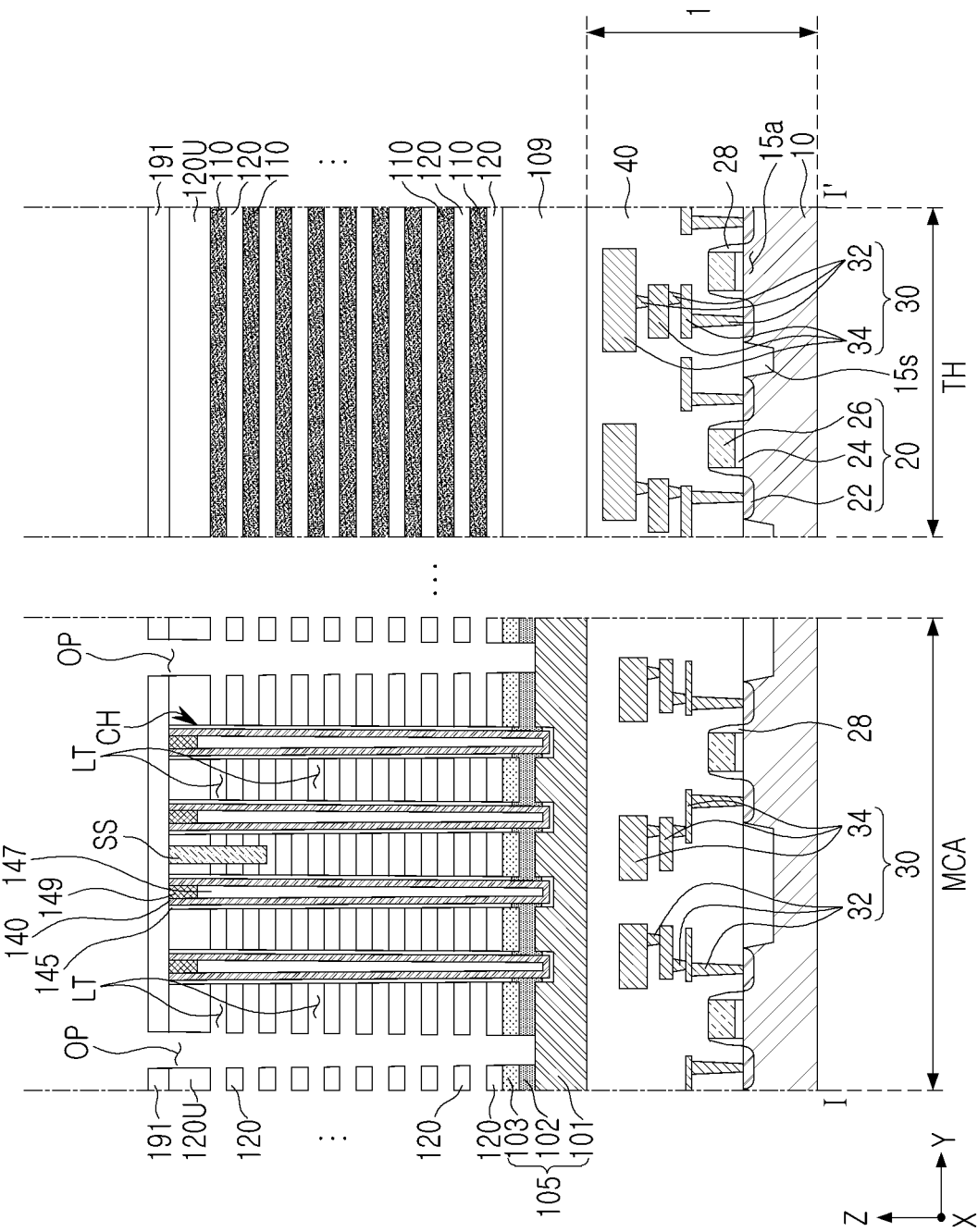

Referring to FIG. 15, lateral openings LT may be formed by forming the first pattern layer 102 in the lower openings LP and then removing a portion of the sacrificial insulating layers 110 through the separation openings OP.

The first pattern layer 102 may be formed by depositing a conductive material in the lower openings LP. The first pattern layer 102 may be in contact with the conductive plate layer 101 and the second pattern layer 103, and may be formed to be in contact with the channel layer 140 on a periphery of the channel layer 140. Accordingly, a pattern structure 105 including the conductive plate layer 101 and the first and second pattern layers 102 and 103 may be formed. Then, the additional sacrificial spacer layers may be removed.

The sacrificial insulating layers 110 may be selectively removed with respect to the interlayer insulating layers 120, the pattern structure 105, and the first upper insulating layer 191. Accordingly, a plurality of lateral openings LT may be formed between the interlayer insulating layers 120. The sacrificial insulating layers 110 may be removed in the memory cell region MCA but may not be removed and may remain in the through-insulating region TH. Referring to FIG. 1, separation openings OP may be formed in a region in which separation regions MS are to be formed. Since an etchant introduced through the separation openings OP does not reach the region, the sacrificial insulating layers 110 may remain in the through-insulating region TH. Alternatively, in the fabricating process of FIGS. 13A and 13B, when the sacrificial insulating layers 110 and the interlayer insulating layers 120 are removed in a region corresponding to the through-insulating region TH and the removed portion is filled with an insulating material to form through-contact insulating layer 115, the semiconductor device 100d of FIGS. 10A and 10B may be fabricated.

Figure 16A:
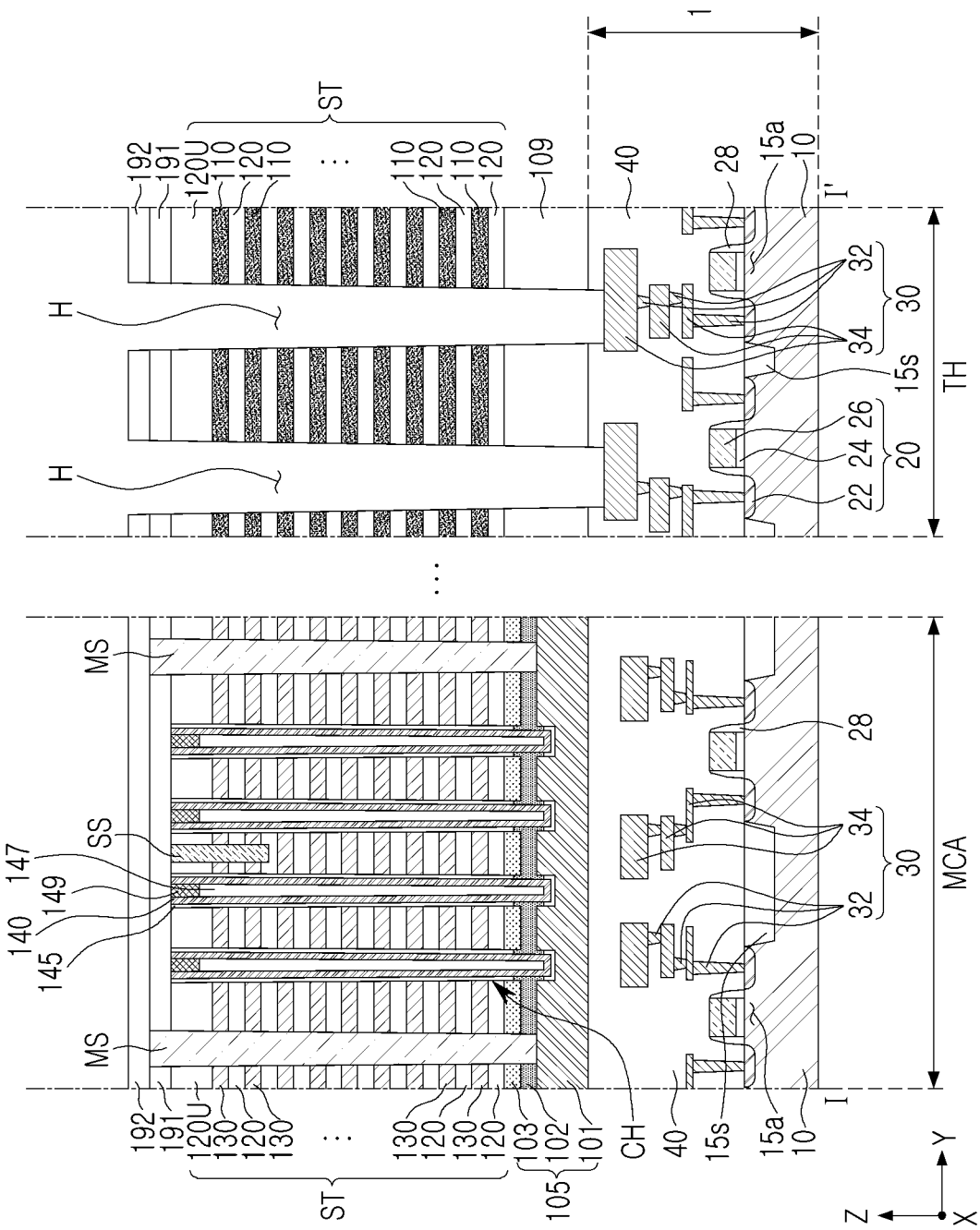
Figure 16B:
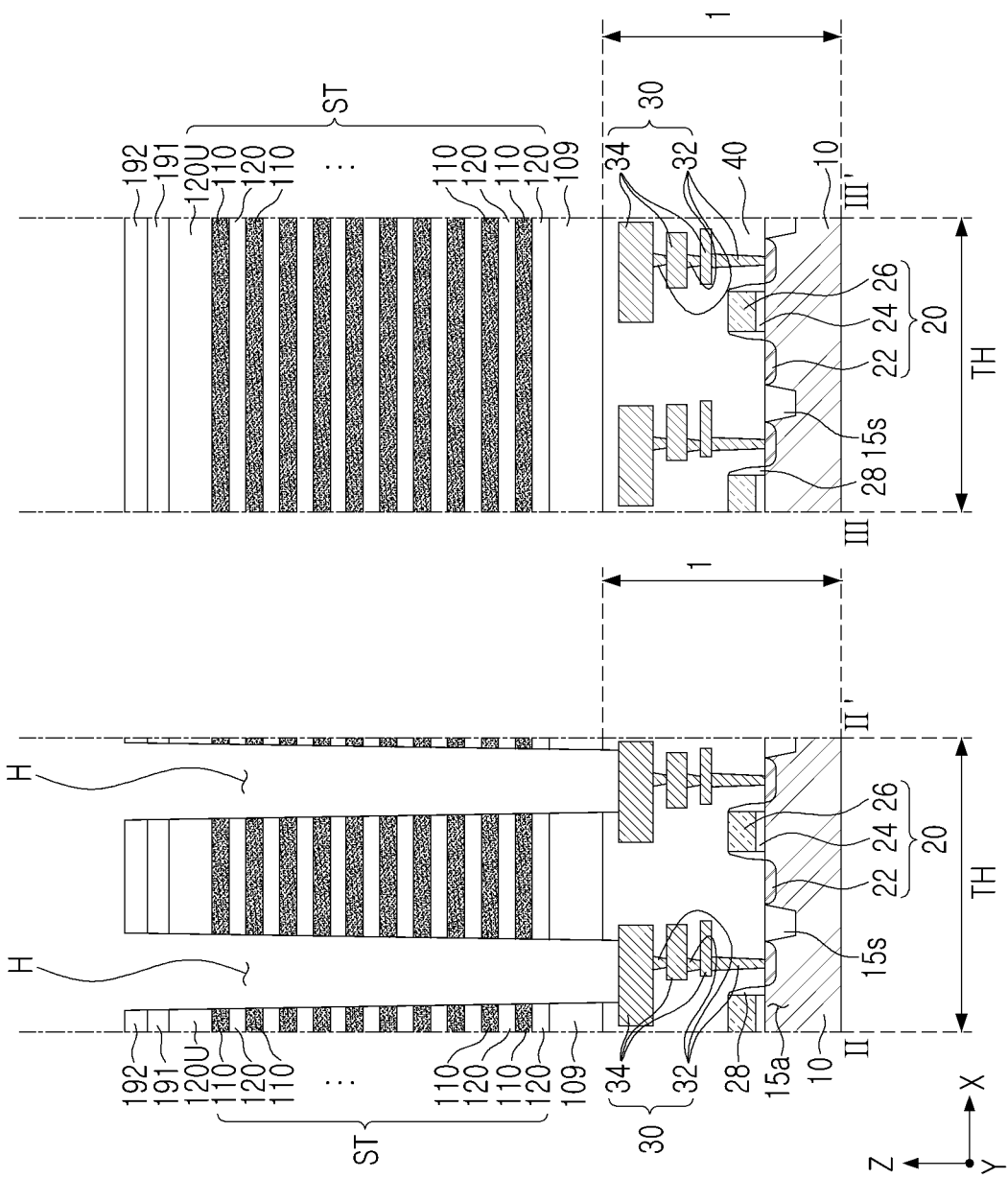

Referring to FIGS. 16A and 16B, gate electrodes 130 may be formed on lateral opening LT, separation regions MS may be formed in the separation openings OP, and through-contact holes H may be formed to penetrate through the sacrificial insulating layers 110 in a through-insulating region T.

The gate electrodes 130 may be formed by filling the lateral opening LT, formed by removing the sacrificial insulating layers 110 through the separation openings OP, with a conductive material. Accordingly, a stack structure ST including the interlayer insulating layers 120 and the gate electrodes 130 alternately stacked in the memory cell region MCA and the interlayer insulating layers 120 and the sacrificial insulating layers 110 alternately stacked in the through-insulating region TH may be formed.

The separation openings OP may be filled with an insulating material to form separation regions MS. According to example embodiments, a separation pattern including an insulating material and a core pattern including a conductive material may be formed in the separation openings OP.

A second upper insulating layer 192 may be formed on the separation regions MS and the first upper insulating layer 191. In the through-insulating region TH, through-contact holes H may be formed to penetrate through the first and second upper insulating layers 191 and 192, the sacrificial insulating layers 110, the interlayer insulating layers 120, and the lower through-insulating layer 109 and to extend lengthwise in the Z direction. Some of the through-contact holes H may extend inwardly of the first structure 1 and the lower interconnection 34 of the lower interconnection structure 30 may be exposed on lower ends of the through-contact holes H.

Figure 17A:
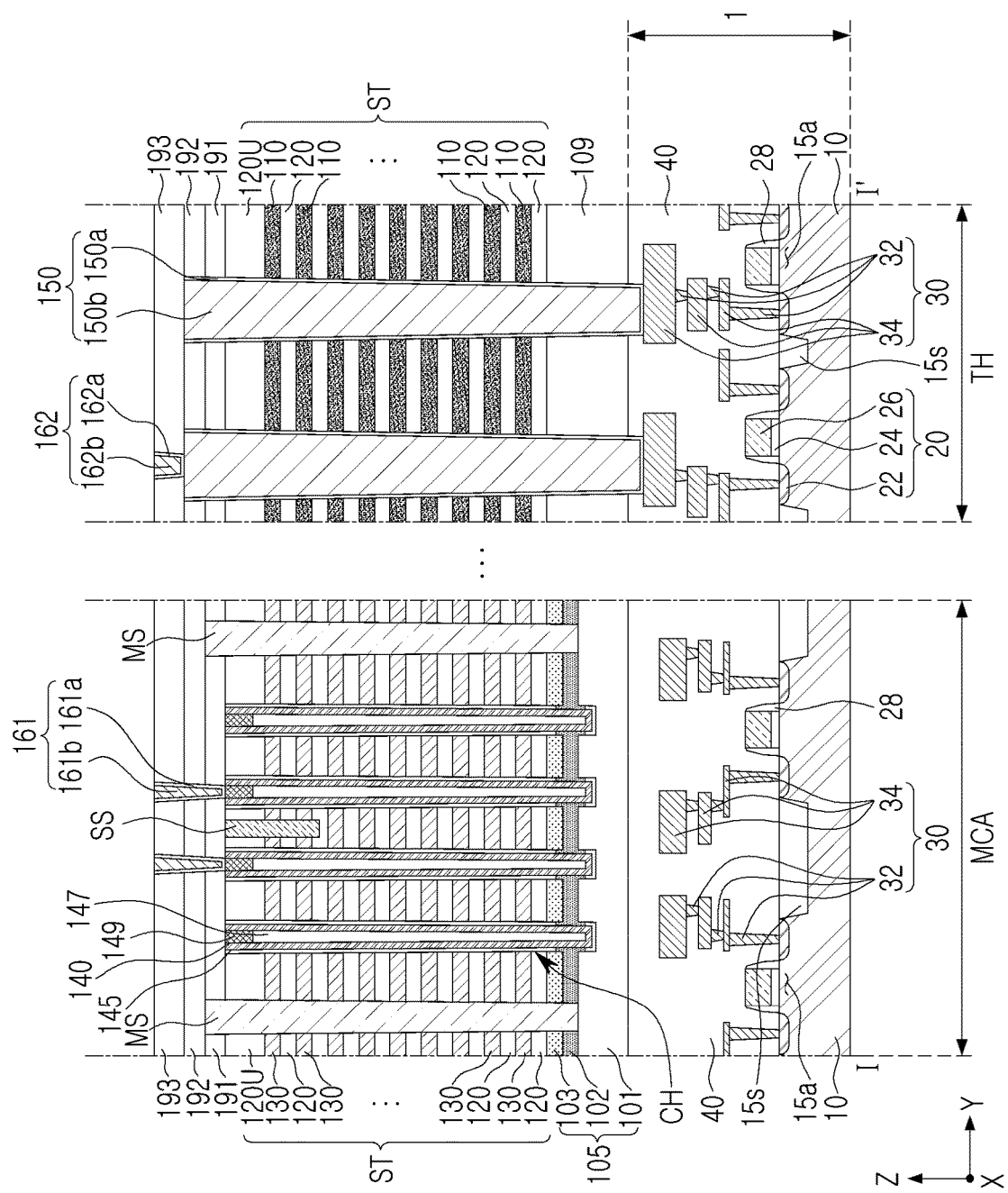
Figure 17B:
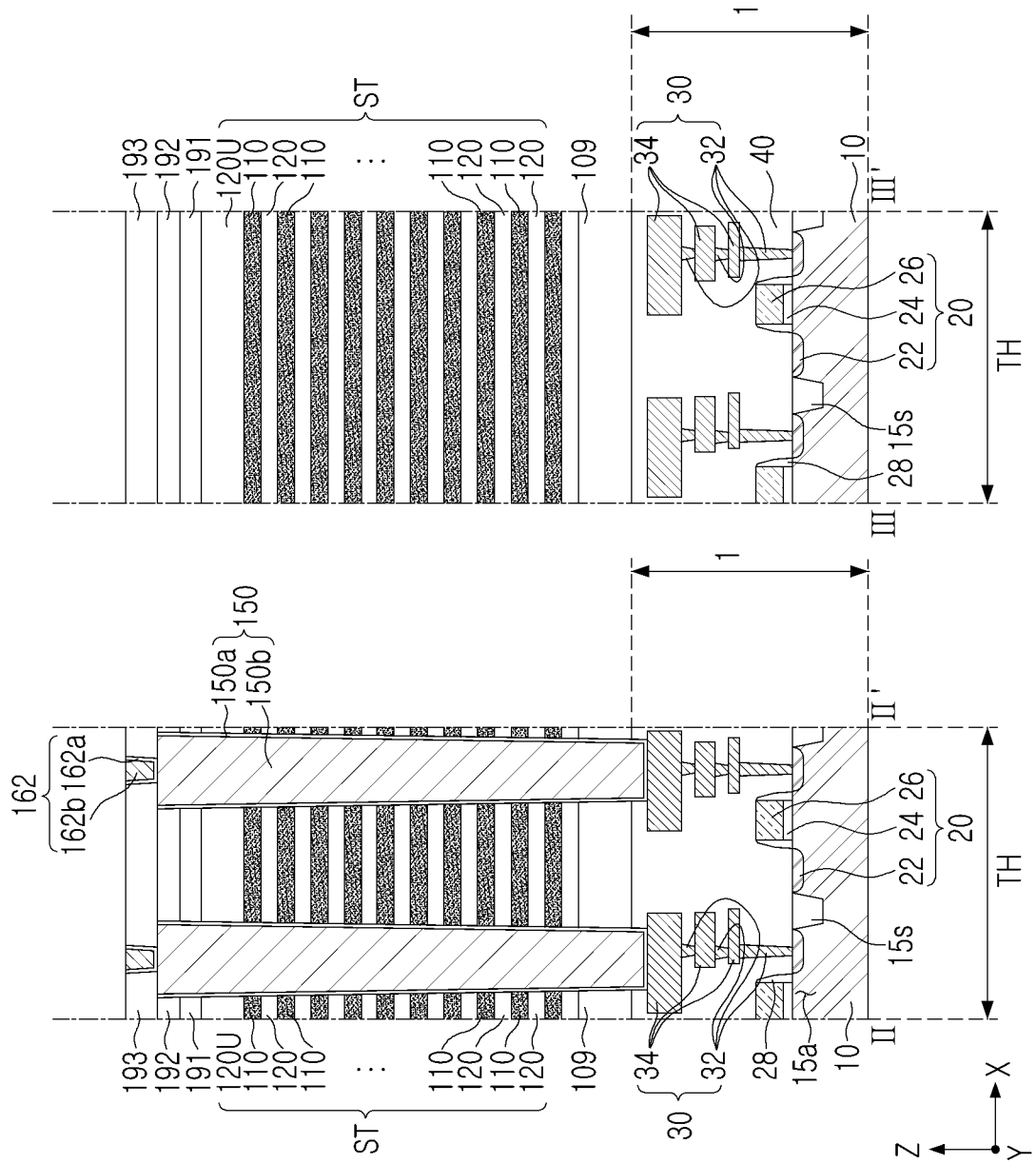

Referring to FIGS. 17A and 17B, a conductive material may be deposited on the through-contact holes H to form through-contact plugs 150 and to form first studs 161 connected to the channel structures CH and second studs 162 connected to the through-contact plugs 150.

A barrier layer 150a may be formed to conformally cover internal sidewalls and bottom surfaces of the through-contact holes CH, and a conductive pattern 150b may be formed to fill a space between internal sidewalls of the barrier layer 150a within the through-contact holes H.

Next, a third upper insulating layer 193 may be formed on the through-contact plugs 150 and the second upper insulating layer 192. First studs 161 may be formed to be connected to the channel pads 149 of the channel structures CH through the first to third upper insulating layers 191, 192, and 193 on the memory cell region MCA, and second studs 162 may be formed to be connected to the through-contact plugs 150 through the third upper insulating layer 193 on the through-insulating region TH.

The forming of the first studs 161 may include sequentially forming a barrier layer 161a and a conductive pattern 161b. The forming of the second studs 162 may include sequentially forming a barrier layer 162a and a conductive pattern 162b.

In the present process, when the dummy studs 163 are formed to be spaced apart from the through-contact plugs 150 and to be disposed between the second studs 162, the semiconductor device 100a of FIGS. 5A and 5B may be fabricated. In the present process, when the process of forming the second studs 162 is omitted and contacts 171, 172, and 173 to be described later are formed, the semiconductor device 100b of FIGS. 7A and 7B may be fabricated.

Figure 18A:
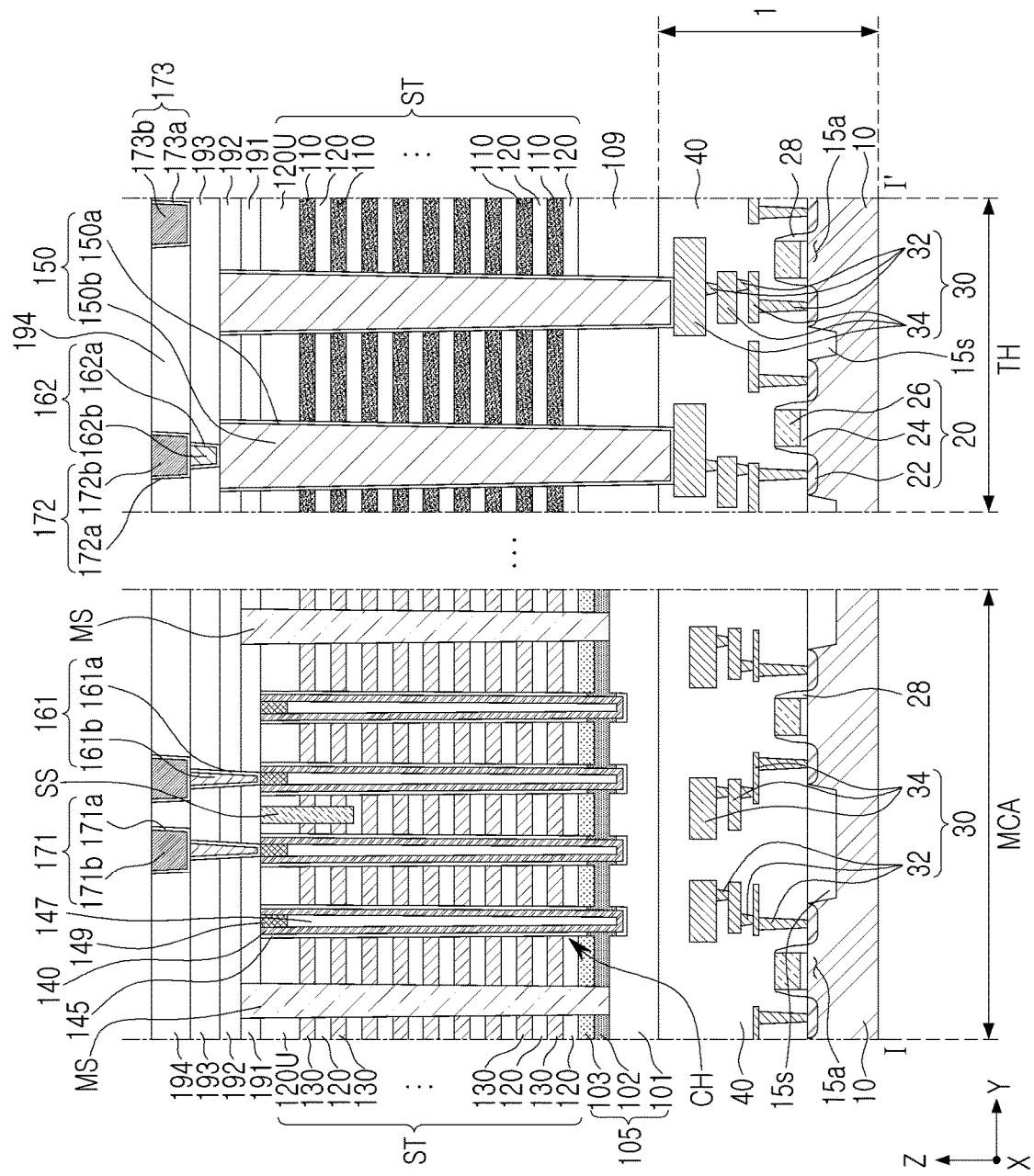
Figure 18B:
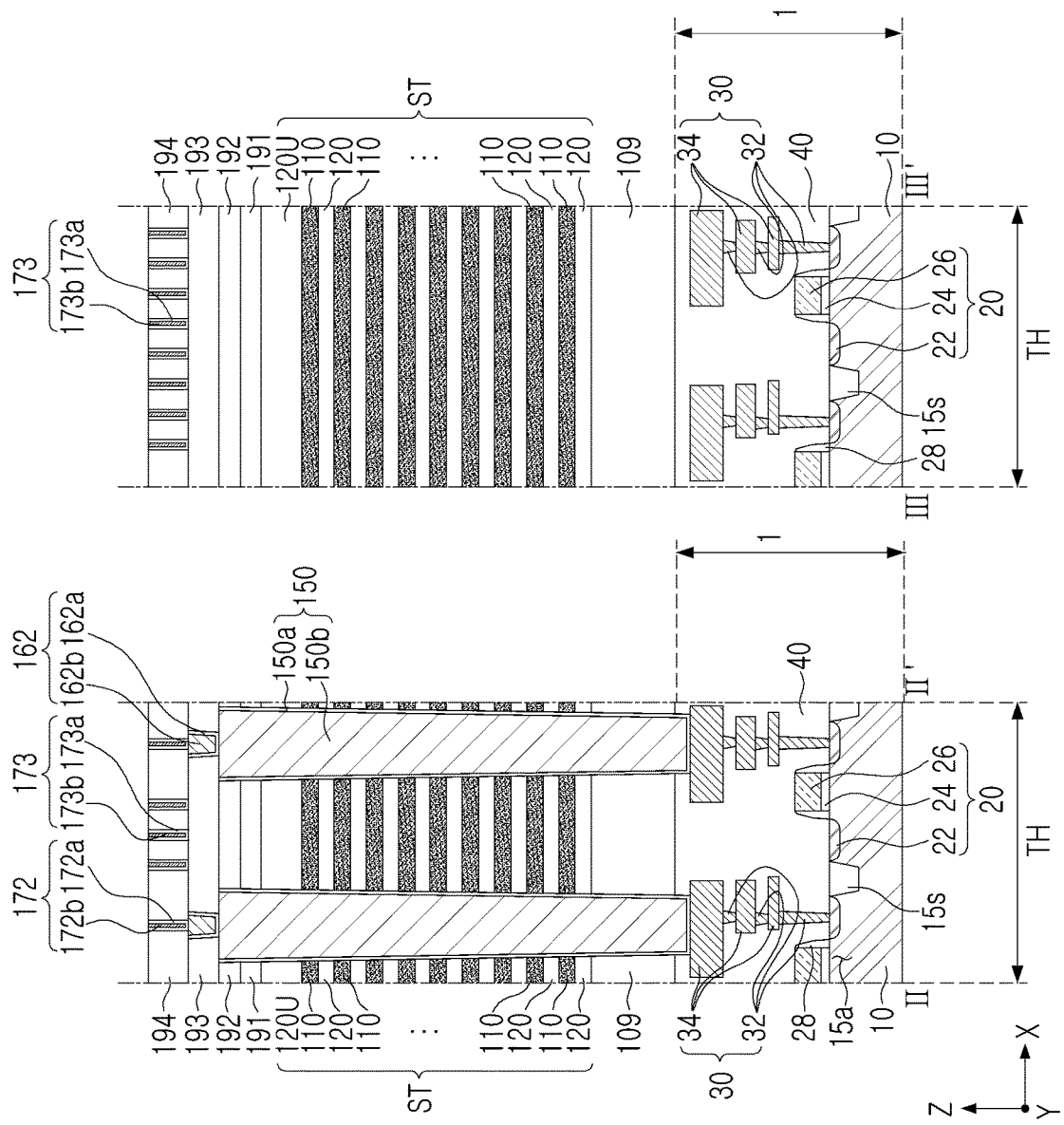

Referring to FIGS. 18A and 18B, first contacts 171 connected to the first studs 161, second contacts 172 connected to the second studs 162, and dummy contacts 173 spaced apart from the second studs 162 may be formed.

A fourth upper insulating layer 194 may be formed on the first and second studs 161 and 162 and the third upper insulating layer 193. First contacts 171 may be formed to be connected to the first studs 161 through the fourth upper insulating layer 194 on the memory cell region MCA, second contacts 172 may be formed to be connected to the second studs 162 on the through-insulating region TH, and dummy contacts 173 may be formed to be spaced apart from the second studs 162 on the through-insulating region TH. Referring to FIG. 2 together, the first contacts 171 may be formed in a zigzag pattern, and the second contacts 172 may be formed to have a lower arrangement density than the first contacts 171, and the dummy contacts 173 may be formed between the second contacts 172.

The forming of the first contacts 171 may include sequentially forming a barrier layer 171a and a conductive pattern 171b. The forming of the second contacts 172 may include sequentially forming a barrier layer 172a and a conductive pattern 172b. The forming of the dummy contacts 173 may include sequentially forming a barrier layer 173a and a conductive pattern 173b.

The first contacts 171 on the memory cell region MCA and the second contacts 172 on the through-insulating region TH may be different in arrangement density of patterns. The term "arrangement density" may refer to a degree to which patterns are arranged to be dense in one region of a plane. A hardmask, used for an etching process in which contacts are formed, may be formed as, for example, an amorphous carbon layer (ACL) or a spin on hardmask (SOH). When the hardmask is used as an SOH, an etching profile formed by the hardmask may be affected by an arrangement density of patterns because the SOH is relatively soft as compared with the ACL. As described in FIG. 2, since the arrangement density of the second contacts 172 is lower than the arrangement density of the first contacts 171, pattern profiles of contacts may be formed to be different from each other on the memory cell region MCA and the through-insulating region TH. According to an example embodiment, the dummy contacts 173 may be disposed together with the second contacts 172 on the through-insulating region TH to reduce a difference in arrangement density of patterns on the memory cell region MCA and the through-insulation region TH. As a result, a semiconductor device having a uniform etching profile may be provided.

Next, a fifth upper insulating layer 195 and bitlines 180 may be formed on the first and second contacts 171 and 172, the dummy contacts 173, and the fourth upper insulating layer 194 to fabricate the semiconductor device 100 of FIGS. 1 to 3C.

Figure 19:
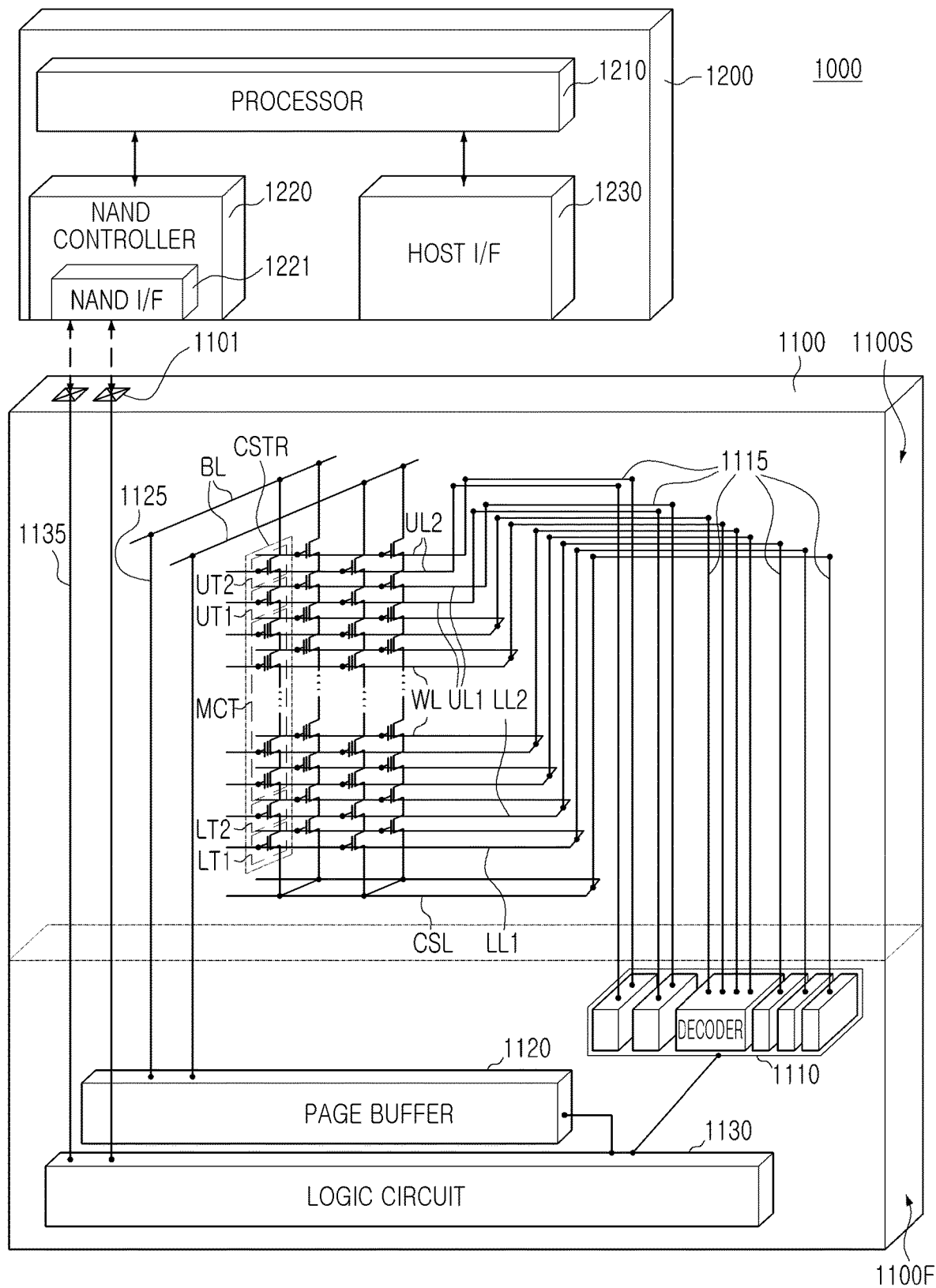
FIG. 19 is a schematic view illustrating a data storage system including a semiconductor device, according to example embodiments.

FIG. 19 is a schematic view illustrating a data storage system including a semiconductor device according to example embodiments.

Referring to FIG. 19, a data storage system 1000 may include a semiconductor device 1100 and a controller 1200 electrically connected to the semiconductor device 1100. The data storage system 1000 may be configured as a storage device including one or a plurality of semiconductor devices 1100 or an electronic device including a storage device. For example, the data storage system 1000 may be configured as a solid-state drive (SSD) device including one or a plurality of semiconductor devices 1100, a universal serial bus (USB), a computing system, a medical device, or a communications device.

The semiconductor device 1100 may be configured as a nonvolatile memory device, for example, a NAND flash memory device described above with reference to FIGS. 1 to 12. The semiconductor device 1100 may include a first structure 1100F and a second structure 1100S on the first structure 1100F. In example embodiments, the first structure 1100F may be disposed adjacent to the second structure 1100S. The first structure 1100F may be configured as a peripheral circuit structure including a decoder circuit 1110, a page buffer 1120, and a logic circuit 1130. The second structure 1100S may be configured as a memory cell structure including a bitline BL, a common source line CSL, wordlines WL, first and second gate upper lines UL1 and UL2, first and second gate lower lines LL1 and LL2, and memory cell strings CSTR between the bitline BL and the common source line CSL.

In the second structure 1100S, each of the memory cell strings CSTR may include lower transistors LT1 and LT2 adjacent to the common source line CSL, upper transistors UT1 and UT2 adjacent to the bitline BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may vary according to example embodiments.

In example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The wordlines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the wordlines WL, and the first and second gate upper lines UL1 and UL2 may be electrically connected to the decoder circuit 1110 through first connecting wirings 1115 extending from the first structure 1100F to the second structure 1100S. The bitlines BL may be electrically connected to the page buffer 1120 through second connection lines 1125 extending from the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through the input/output connection wiring 1135 extending from the first structure 1100F to the second structure 1100S.

The controller 1200 may include a processor 1210, a NAND controller 1220, and a host interface 1230. According to example embodiments, the data storage system 1000 may include a plurality of semiconductor devices 1100. In this case, the controller 1200 may control the plurality of semiconductor devices 1100.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface (I/F) 1221 for processing communication with the semiconductor device 1100. A control command for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communications function between the data storage system 1000 and an external host. When a control command is received from an external host through the host interface 1230, the processor 1210 may control the semiconductor device 1100 in response to the control command.

Figure 20:
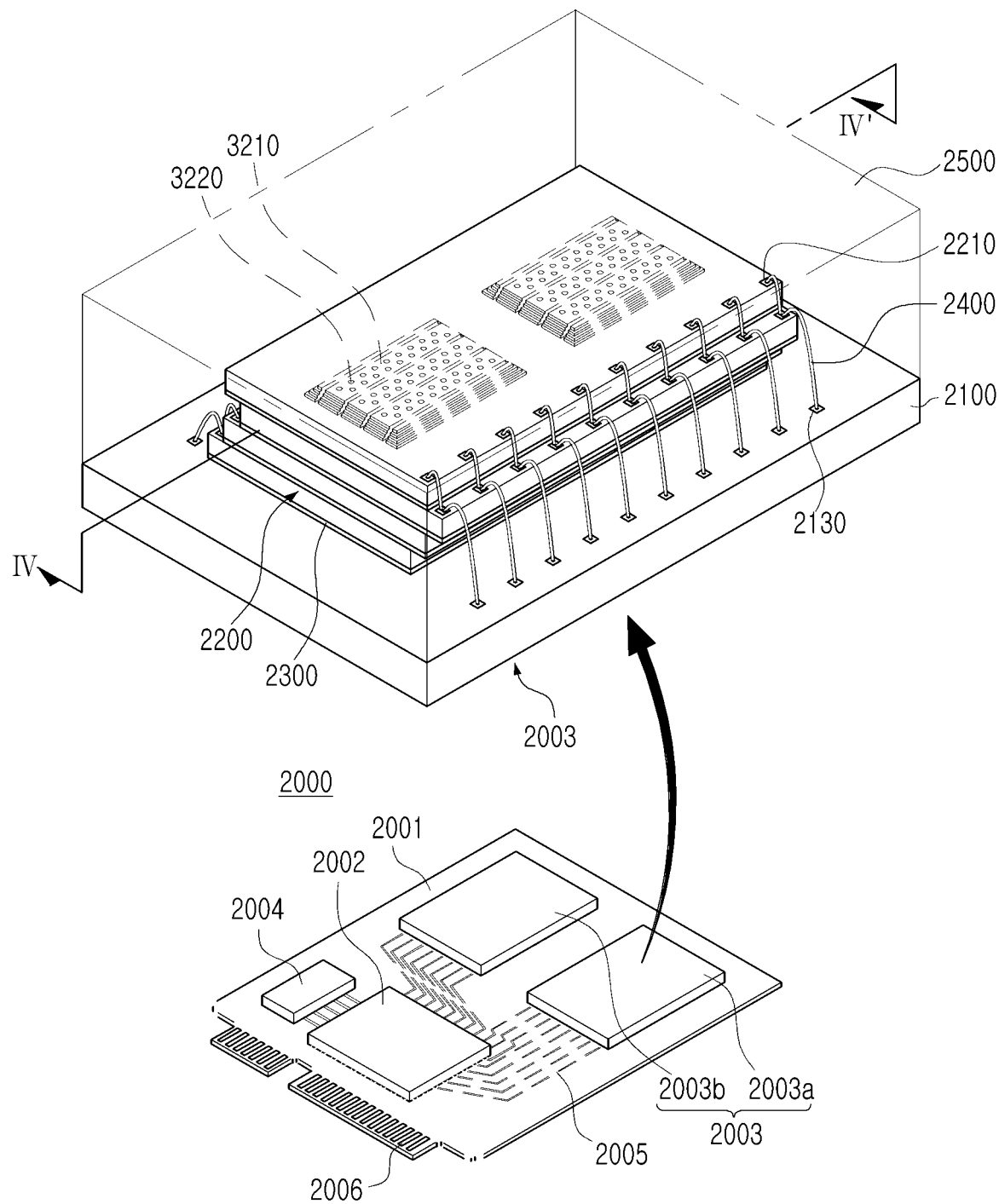
FIG. 20 is a schematic perspective view illustrating a data storage system including a semiconductor device, according to example embodiments.

FIG. 20 is a schematic perspective view illustrating a data storage system including a semiconductor device according to example embodiments.

Referring to FIG. 20, a data storage system 2000 according to some example embodiments may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and the arrangement of the plurality of pins in the connector 2006 may vary depending on a communications interface between the data storage system 2000 and an external host. In example embodiments, the data storage system 2000 may communicate with an external host according to one of interfaces such as universal serial bus (USB), peripheral component interconnect express (PCI-Express), serial advanced technology attachment (SATA), M-PHY for universal flash storage (UFS), or the like. In example embodiments, the data storage system 2000 may operate by power supplied from an external host through the connector 2006. The data storage system 2000 may further include a power management integrated circuit (PMIC) which may distribute power, supplied from an external host, to the controller 2002 and the semiconductor package 2003.

The controller 2002 may write data in the semiconductor package 2003 or may read data from the semiconductor package 2003, and may increase an operating speed of the data storage system 2000.

The DRAM 2004 may be configured as a buffer memory for mitigating a difference in speed between the semiconductor package 2003, a data storage space, and an external host. The DRAM 2004 included in the data storage system 2000 may also operate as a type of cache memory, and may provide a space for temporarily storing data in a control operation for the semiconductor package 2003. When the DRAM 2004 is included in the data storage system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include an input/output pad 2210. The input/output pad 2210 may correspond to the input/output pad 1101 in FIG. 20. Each of the semiconductor chips 2200 may include gate stack structures 3210 and channel structures 3220. Each of the semiconductor chips 2200 may include the semiconductor device described above with reference to FIGS. 1 to 12.

In example embodiments, the connection structure 2400 may be configured as a bonding wire electrically connecting the input/output pad 2210 to the package upper pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other through a connection structure including a through-silicon via (TSV), rather than the bonding wire-type connection structure 2400.

In example embodiments, the controller 2002 and the semiconductor chips 2200 may be included in a single package. In example embodiments, the controller 2002 and the semiconductor chips 2200 may be mounted on an interposer substrate different from the main substrate 2001, and the controller 2002 and the semiconductor chips may be connected to each other by an interconnection formed on the interposer substrate.

Figure 21:
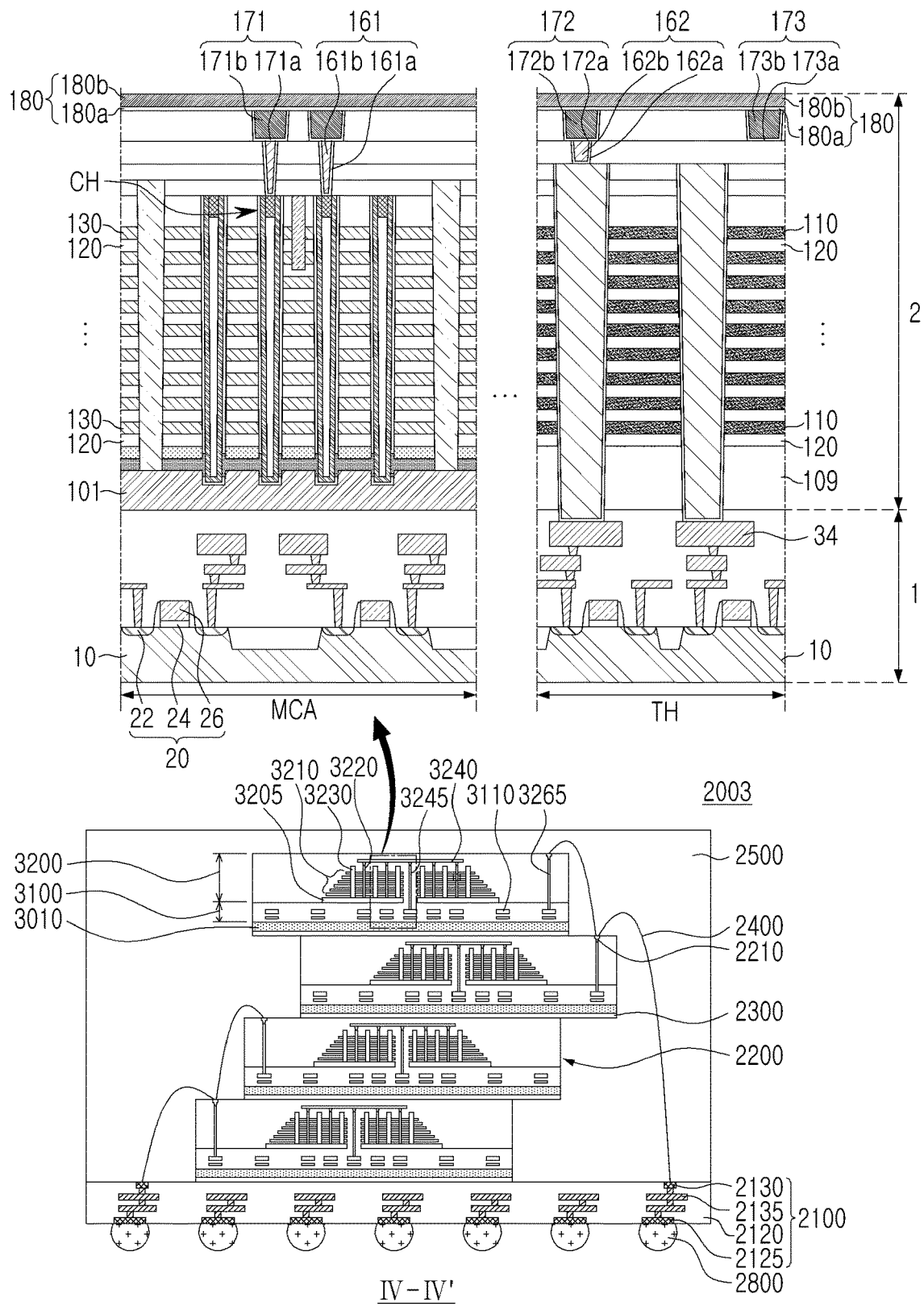
FIG. 21 is a schematic perspective view illustrating a semiconductor package, according to example embodiments.

FIG. 21 is a schematic perspective view illustrating a semiconductor package according to example embodiments. FIG. 21 illustrates an example embodiment of the semiconductor package 2003 in FIG. 20, and conceptually illustrates a region taken along line IV-IV' of FIG. 20.

Referring to FIG. 21, in a semiconductor package 2003, a package substrate 2100 may be configured as a printed circuit board (PCB). The package substrate 2100 may include a package substrate body portion 2120, package upper pads 2130 (see FIG. 20) disposed on an upper surface of the package substrate body portion 2120, lower pads 2125 disposed on or exposed through a lower surface of the package substrate body portion 2120, and internal interconnections 2135 electrically connecting the package upper pads 2130 to the lower pads 2125 in the package substrate body portion 2120. The package upper pads 2130 may be electrically connected to the connection structures 2400. The lower pads 2125 may be connected to the interconnection patterns 2005 of the main substrate 2010 of the data storage system 2000 as illustrated in FIG. 20 through the conductive connection portions 2800.

Each of the semiconductor chips 2200 may include a semiconductor substrate 3010 and a first structure 3100 and a second structure 3200 sequentially stacked on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 and isolation regions 3230 penetrating the gate stack structure 3210, bitlines 3240 electrically connected to the memory channel structures 3220, and gate contact plugs (not illustrated) electrically connected to wordlines WL (see FIG. 19) of the gate stack structure 3210. As described above with reference to FIGS. 1 to 12, each of the semiconductor chips 2200 may include a substrate 10, a conductive plate layer 101, gate electrodes 130, sacrificial insulating layers 110, interlayer insulating layers 120, a channel structure CH, first studs 161, second studs 162, first contacts 171, second contacts 172, and dummy contacts 173.

Each of the semiconductor chips 2200 may include a through-interconnection 3245 electrically connected to the peripheral interconnections 3110 of the first structure 3100 and extending inwardly of the second structure 3200. The first through-interconnection 3265 may be disposed on an external side of the gate stack structure 3210, and the second through-interconnection 3245 may be disposed to penetrate through the gate stack structure 3210. Each of the semiconductor chips 2200 may further include an input/output pad 2210 (see FIG. 19) electrically connected to the peripheral interconnections 3110 of the first structure 3100 by way of the first through-interconnection structure 3265.

As described above, contacts may be disposed to be spaced apart from through-contact plugs and to be connected to bitlines. Thus, a semiconductor device having improved reliability and productivity and a data storage system including the same may be provided.

While example embodiments have been shown and described above, it will be apparent to those skilled in the art that modifications and variations could be made without departing from the scope of the present inventive concept as defined by the appended claims.

What is claimed is:

1. A semiconductor device comprising:
   a first structure including a substrate, circuit devices on the substrate, and lower contacts and lower interconnections electrically connected to the circuit devices; and
   a second structure overlapping the first structure in a vertical direction,
   wherein the second structure comprises:
      a conductive layer;
      a stack structure disposed on the conductive layer and having a memory cell region and a through-insulating region adjacent to the memory cell region, the stack structure including gate electrodes disposed in the memory cell region, sacrificial insulating layers disposed in the through-insulating region, and interlayer insulating layers disposed between the gate electrodes and between the sacrificial insulating layers;
      separation regions penetrating through the gate electrodes of the stack structure in the vertical direction;
      channel structures penetrating through the gate electrodes of the stack structure in the vertical direction, each of the channel structures including a channel layer electrically connected to the conductive layer;
      through-contact plugs penetrating through the sacrificial insulating layers of the stack structure in the through-insulating region to be connected to the lower interconnections of the first structure; and
      an upper interconnection structure on the channel structures and the through-contact plugs,
   wherein the upper interconnection structure comprises:
      bitlines extending lengthwise in a second direction perpendicular to a first direction;
      first contacts disposed between the bitlines and the channel layers to electrically connect the bitlines and the channel layers to each other on the memory cell region;
      second contacts disposed between the bitlines and the through-contact plugs to electrically connect the bitlines and the through-contact plugs to each other on the through-insulating region; and
      dummy contacts disposed between the second contacts and connected to the bitlines on the through-insulating region,
   wherein the second contacts are spaced apart from the through-contact plugs in the vertical direction, and
   wherein the dummy contacts overlap with the sacrificial insulating layers and the interlayer insulating layers in the vertical direction.

2. The semiconductor device of claim 1, wherein the dummy contacts are spaced apart from the through-contact plugs.

3. The semiconductor device of claim 1, wherein the second structure comprises:
   upper insulating layers disposed on the stack structure, the upper interconnection structure is disposed in the upper insulating layers;
   first studs penetrating through at least one of the upper insulating layers to electrically connect the channel layers and the first contacts to each other; and
   second studs penetrating through at least one of the upper insulating layers to electrically connect the through-contact plugs and the second contacts to each other.

4. The semiconductor device of claim 3, wherein lower regions of the dummy contacts are surrounded by an insulating material forming at least one of the upper insulating layers.

5. The semiconductor device of claim 3, wherein the second structure further comprises:
   dummy studs connected to lower regions of the dummy contacts, disposed between the second studs, and spaced apart from the through-contact plugs.

6. The semiconductor device of claim 1,
   wherein the dummy contacts are disposed side by side with the second contacts,
   wherein a lower surface of at least one of the second contacts includes a first portion disposed at a first level from an upper surface of the substrate and a second portion disposed at a second level from the upper surface of the substrate,
   wherein the first level is higher than the second level, based on the upper surface of the substrate, and
   wherein a lower surface of at least one of the dummy contacts is disposed at a level lower than the first level.

7. The semiconductor device of claim 6,
   wherein the second structure further includes studs disposed between at least one through-contact plug of the through-contact plugs and at least one second contact to electrically connect the at least one through-contact plug and the at least one second contact to each other,
   wherein the first portion is in contact with an upper surface of one of the studs, and
   wherein the second portion is disposed at a level lower than the upper surface of the one of the studs.

8. The semiconductor device of claim 1,
   wherein the second contacts are arranged at a lower arrangement density than the first contacts,
   wherein the bitlines are arranged at a first pitch in the first direction, and
   wherein the dummy contacts are arranged at a second pitch in the first direction, the second pitch being about two times or more and about four times or less of the first pitch.

9. The semiconductor device of claim 1, wherein each of the through-contact plugs, the first contacts, the second contacts, and the dummy contacts includes a conductive pattern and a barrier layer covering a side surface and a bottom surface of the conductive pattern.

10. A semiconductor device comprising:
a first structure including a substrate, circuit devices on the substrate, and a lower interconnection structure electrically connected to the circuit devices; and
a second structure overlapping the first structure in a vertical direction,
wherein the second structure comprises:
a conductive layer;
gate electrodes spaced apart from each other on the conductive layer in the vertical direction and extending lengthwise in a first direction;
separation regions penetrating through the gate electrodes in the vertical direction and extending lengthwise in the first direction;
channel structures penetrating through the gate electrodes in the vertical direction and respectively including a channel layer electrically connected to the conductive layer;
through-contact plugs spaced apart from the gate electrodes and extending in the vertical direction to be electrically connected to the lower interconnection structure of the first structure;
first contacts respectively electrically connected to the channel layer on the channel structures;
second contacts respectively electrically connected to the through-contact plugs on the through-contact plugs;
bitlines electrically connecting at least one of the first contacts arranged in a second direction perpendicular to the first direction and at least one of the second contacts to each other, the bitlines extending lengthwise in the second direction; and
dummy contacts connected to the bitlines and spaced apart from the through-contact plugs,
wherein upper surfaces of the first contacts, upper surfaces of the second contacts, and upper surfaces of the dummy contacts are in contact with the bitlines, and
wherein lower surfaces of the second contacts are spaced apart from the through-contact plugs in the vertical direction, and
wherein a lower surface of each of the first contacts, a lower surface of each of the second contacts, and a lower surfce of each of the dummy contacts are disposed at the same level.

11. The semiconductor device of claim 10, wherein the dummy contacts are disposed so as not to overlap the through-contact plugs in the vertical direction.

12. The semiconductor device of claim 10, wherein the dummy contacts are disposed side by side with the second contacts on substantially the same height level as the second contacts.

13. The semiconductor device of claim 10,
wherein the second contacts are arranged at a lower arrangement density than the first contacts, and
wherein the dummy contacts are disposed between the second contacts in the first direction and between the second contacts in the second direction.

14. The semiconductor device of claim 10, wherein the second structure further comprises:
first studs between the channel structures and the first contacts; and
second studs between the through-contact plugs and the second contacts.

15. The semiconductor device of claim 14, wherein the dummy contacts are spaced apart from the second studs.

16. The semiconductor device of claim 14, wherein the second structure further comprises:

dummy studs connected to lower regions of the dummy contacts, disposed between the second studs, and spaced apart from the through-contact plugs.

17. The semiconductor device of claim 14,
wherein the dummy contacts include at least one dummy contact having a first height in the vertical direction,
wherein the second contacts include at least one second contact having a second height in the vertical direction in a region in which the second contacts overlap at least one of the second studs in the vertical direction, and
wherein the first height is greater than the second height.

18. The semiconductor device of claim 10,
wherein the second structure includes a stack structure including at least one insulating layer, surrounding at least a portion of side surfaces of the through-contact plugs and the gate electrodes,
wherein the stack structure has a memory cell region in which the gate electrodes and the channel structures are disposed and a through-insulating region adjacent to the memory cell region in which the at least one insulating layer and the through-contact plugs are disposed,
wherein the first contacts are disposed on the memory cell region, and
wherein the second contacts and the dummy contacts are disposed on the through-insulating region.

19. A semiconductor device comprising:
a conductive layer;
a stack structure disposed on the conductive layer and having a memory cell region and a through-insulating region adjacent to the memory cell region, the stack structure including gate electrodes disposed in the memory cell region, sacrificial insulating layers disposed in the through-insulating region, and interlayer insulating layers disposed between the gate electrodes and between the sacrificial insulating layers;
separation regions penetrating through the gate electrodes of the stack structure in a vertical direction;
channel structures penetrating through the gate electrodes of the stack structure in the vertical direction, each of the channel structures including a channel layer electrically connected to the conductive layer;
through-contact plugs penetrating through the sacrificial insulating layers of the stack structure in the through-insulating region; and
an upper interconnection structure on the channel structures and the through-contact plugs,
wherein the upper interconnection structure comprises:
bitlines extending lengthwise in a second direction perpendicular to a first direction;
first contacts disposed between the bitlines and the channel layers to electrically connect the bitlines and the channel layers to each other on the memory cell region;
second contacts disposed between the bitlines and the through-contact plugs to electrically connect the bitlines and the through-contact plugs to each other on the through-insulating region; and
dummy contacts disposed between the second contacts and connected to the bitlines on the through-insulating region, and
wherein the dummy contacts overlap with the sacrificial insulating layers and the interlayer insulating layers in the vertical direction.

20. The semiconductor device of claim 19, further comprising:

upper insulating layers on the gate electrodes;
first studs penetrating through at least one of the upper insulating layers to electrically connect the channel layers and the first contacts to each other; and
second studs penetrating through at least one of the upper insulating layers to electrically connect the through-contact plugs and the second contacts to each other, and
wherein the dummy contacts are spaced apart from the second studs.

\* \* \* \* \*